(12) United States Patent
Bertram, Jr. et al.

(10) Patent No.: US 8,431,419 B2
(45) Date of Patent: Apr. 30, 2013

(54) UV ABSORPTION BASED MONITOR AND CONTROL OF CHLORIDE GAS STREAM

(75) Inventors: Ronald Thomas Bertram, Jr., Mesa, AZ (US); Chantal Arena, Mesa, AZ (US); Christiaan J. Werkhoven, Gilbert, AZ (US); Michael Albert Tischler, Scottsdale, AZ (US); Vasil Vorsa, Coopersburg, PA (US); Andrew D. Johnson, Doylestown, PA (US)

(73) Assignee: Soitec, Bernin (FR)

( * ) Notice: Subject to any disclaimer, the term of this patent is extended or adjusted under 35 U.S.C. 154(b) by 70 days.

(21) Appl. No.: 13/060,639

(22) PCT Filed: Jul. 21, 2009

(86) PCT No.: PCT/IB2009/006355
§ 371 (c)(1),
(2), (4) Date: May 23, 2011

(87) PCT Pub. No.: WO2010/023516
PCT Pub. Date: Mar. 4, 2010

(65) Prior Publication Data
US 2011/0212546 A1  Sep. 1, 2011

Related U.S. Application Data

(60) Provisional application No. 61/092,610, filed on Aug. 28, 2008.

(51) Int. Cl.
*H01L 21/00* (2006.01)
(52) U.S. Cl.
USPC .......... 438/5; 438/681; 257/E21.328

(58) Field of Classification Search ........... 438/676, 438/707; 257/E21.33, E21.331, E21.348, 257/E21.349
See application file for complete search history.

(56) References Cited

U.S. PATENT DOCUMENTS

| | | | |
|---|---|---|---|
| 4,418,646 A | 12/1983 | Zajac | 118/733 |
| 4,534,314 A | 8/1985 | Ackley | 118/733 |
| 5,032,435 A | 7/1991 | Biefeld et al. | 427/8 |
| 5,070,246 A | 12/1991 | Durham et al. | 250/373 |
| 5,257,278 A | 10/1993 | Laymon et al. | 372/99 |
| 5,394,237 A | 2/1995 | Chang et al. | 356/328 |
| 5,420,432 A | 5/1995 | Manook et al. | 250/373 |

(Continued)

FOREIGN PATENT DOCUMENTS

| | | |
|---|---|---|
| GB | 2 441 582 A | 3/2008 |
| JP | 05335250 A2 | 12/1993 |
| JP | 2003-077782 A | 3/2003 |
| WO | WO 2008/064083 A2 | 5/2008 |

OTHER PUBLICATIONS

International Search Report, PCT/IB2009/006355, mailed Feb. 9, 2010.

(Continued)

*Primary Examiner* — Cheung Lee
(74) *Attorney, Agent, or Firm* — Winston & Strawn LLP

(57) ABSTRACT

A semiconductor growth system includes a chamber and a source of electromagnetic radiation. A detector is arranged to detect absorption of radiation from the source by a chloride-based chemical of the reaction chamber. A control system controls the operation of the chamber in response to the absorption of radiation by the chloride-based chemical. The control system controls the operation of the chamber by adjusting a parameter of the reaction chamber.

15 Claims, 8 Drawing Sheets

U.S. PATENT DOCUMENTS

| | | | |
|---|---|---|---|
| 5,436,459 A | 7/1995 | Koch et al. | 250/373 |
| 5,652,431 A | 7/1997 | DeSisto et al. | 250/373 |
| 5,703,689 A | 12/1997 | Powell | 356/432 |
| 6,059,507 A | 5/2000 | Adams | 414/217.1 |
| 6,146,458 A | 11/2000 | Hooper et al. | 117/106 |
| 6,194,742 B1 | 2/2001 | Kern et al. | 257/94 |
| 6,229,150 B1 | 5/2001 | Takayama et al. | 257/12 |
| 6,441,393 B2 | 8/2002 | Goetz et al. | 257/13 |
| 6,521,917 B1 | 2/2003 | Takayama et al. | 257/103 |
| 6,734,967 B1 | 5/2004 | Piwonka-Corle et al. | 356/369 |
| 6,741,348 B2 | 5/2004 | Larsen et al. | 356/319 |
| 6,815,309 B2 | 11/2004 | Letertre et al. | 438/406 |
| 6,852,997 B2 | 2/2005 | Yamazaki et al. | 257/40 |
| 6,900,070 B2 | 5/2005 | Craven et al. | 438/41 |
| 6,908,828 B2 | 6/2005 | Letertre et al. | 438/406 |
| 6,925,101 B2 | 8/2005 | Matsumura | 372/46 |
| 6,953,736 B2 | 10/2005 | Ghyselen et al. | 438/458 |
| 6,954,478 B2 | 10/2005 | Nomura et al. | 372/46 |
| 6,980,285 B1 | 12/2005 | Hansen | 356/41 |
| 7,288,775 B2 | 10/2007 | Fujinoki et al. | 250/492.1 |
| 2003/0045961 A1 | 3/2003 | Nakao | 700/121 |
| 2006/0009976 A1 | 1/2006 | Chang | 704/260 |
| 2006/0076559 A1 | 4/2006 | Faure et al. | 257/49 |
| 2006/0099776 A1 | 5/2006 | Dupont | 438/479 |
| 2006/0118513 A1 | 6/2006 | Faure et al. | 216/33 |
| 2007/0072324 A1 | 3/2007 | Krames et al. | 438/46 |
| 2007/0218703 A1 | 9/2007 | Kaeding et al. | 438/775 |
| 2008/0124453 A1 | 5/2008 | Bour et al. | 427/10 |
| 2009/0023296 A1* | 1/2009 | Nishizuka | 438/719 |

OTHER PUBLICATIONS

Hellman, E.S. "The Polarity of GaN: a Critical Review", MRS Internet Journal Nitride Semiconductor Research, vol. 3, pp. 1-11 (1998).

Karlicek, R.F. et al. "Remote Optical Monitoring of Reactants in a Vapor Phase Epitaxial Reactor", Journal of Crystal Growth, vol. 73, pp. 364-368 (1985).

Kuniya, Y. et al., "Vapor Phase Equilibria in the Systems In-$InCl_3$ and Ga-$GaCl_3$", Journal of Crystal Growth, vol. 28, pp. 385-391 (1975).

Laubengayer, A.W. et al., "The Chlorides of Gallium", Contribution from the Department of Chemistry of Cornell University, vol. 62, pp. 1578-1583 (1940).

Mastro M.A., et al., "Thermal Stability of MOCVD and HVPE GaN Layers in $H_2$ HCl $NH_3$ and $N_2$," Phys. Stat. Sol., vol. 188, No. 1, pp. 467-471 (2001).

Mastro M.A., et al., "Influence of Polarity on GaN Thermal Stability" Journal of Crystal Growth, vol. 274, pp. 38-46 (2005).

Stutzmann, M. et al. "Playing with Polarity", Phys. Stat. Sol., vol. 228, No. 2, pp. 505-512 (2001).

Alexandrov, S.E., et al. "A Study of CVD of Gallium Nitride Films by In Situ Gas-Phase UV Spectroscopy", Journal De Physique IV, Colloque C5, supplement au Journal de Physique II, vol. 5, Jun. 1995, pp. C5-183-190.

Cho, Soon, et al. "In situ chemical sensing in AlGaN/GaN high electron mobility transistor metalorganic chemical vapor deposition process for real-time prediction of product crystal quality and advanced process control", J. Vac. Sci. Technol. B 23(4), (2005), pp. 1386-1397.

Johnson, M.C., et al. "In situ monitoring and control of multicomponent gas-phase streams for growth of GaN via MOCVD", Journal of Crystal Growth 212 (2000), pp. 11-20.

Karlicke, Jr., R.F. et al. , "Growth of GaN blue LEDs with in situ growth monitoring", III-Vs Review, vol. 10, No. 2 (1997) pp. 20-24.

Kobayashi, Yasuyuki, et al., "In-situ monitoring of GaN MOVPE by shallow-angle reflectance using ultraviolet light", Journal of Crystal Growth 195 (1998), pp. 187-191.

* cited by examiner

UV ABSORPTION BASED MONITOR AND CONTROL OF CHLORIDE GAS STREAM This application is a 371 filing of International Patent Application PCT/IB2009/006355 filed Jul. 21, 2009, which claims the benefit of application no. 61/092,610 filed Aug. 28, 2008.

FIELD OF THE INVENTION

This invention relates to systems for forming semiconductor materials.

BACKGROUND OF THE INVENTION

Semiconductor growth systems may be used to form a number of different semiconductor materials, such as nitride-based semiconductors. Examples of nitride-based semiconductors include gallium nitride and its alloys. Nitride-based semiconductors may be formed using semiconductor growth systems, such as those associated with metallorganic chemical vapor deposition (MOCVD) and hydride (or halide) vapor phase epitaxy (HVPE). More information regarding MOCVD and HVPE growth systems may be found in U.S. Patent Application Nos. 20060076559 and 20060118513, as well as in M. A. Mastro et al., "Influence of polarity on GaN thermal Stability", Journal of Crystal Growth, Vol. 274, Pages 38-46 (2005) and M. A. Mastro et al., "Thermal stability of MOCVD and HVPE GaN layers in $H_2$, HCl, $NH_3$ and $N_2$", Physica Status Solidi (a), Vol. 188, No. 1, Pages 467-471 (2001).

Semiconductor growth systems generally include a reaction chamber in which a layer of the nitride-based semiconductor is formed on a substrate in response to the introduction of one or more gases therein. The semiconductor growth system typically includes gas lines coupled to the reaction chamber so that the gases may be flowed into it. Further, the semiconductor growth system often includes a heater which heats the gases so they decompose into one or more chemical species. The heater also heats the substrate to a growth temperature so the chemical species interact and form the semiconductor layer on the substrate.

The gases generally depend on the growth system being used to form the layer of semiconductor material. For example, HVPE utilizes hydride precursor gases, such as arsine ($AsH_3$), ammonia ($NH_3$) and phosphine ($PH_3$), as well as additional precursor gases. Further, MOCVD utilizes gases, such as trimethylgallium ($Ga(CH_3)_3$), trimethylaluminum ($Al_2(CH_3)_6$) and trimethylindium ($In(CH_3)_3$), as well as additional precursor gases. One type of precursor gas is a metal-chloride based precursor gas, such as gallium chloride (GaCl), aluminum chloride (AlCl) and indium chloride (InCl). Precursor gases of GaCl, AlCl and InCl are used to form gallium nitride, aluminum nitride and indium nitride, respectively, and alloys thereof. Precursor gases may be provided, such as by forming them in-situ by flowing a chlorine containing gas, such as hydrogen chloride (HCl), over a molten metal of gallium, aluminum or indium. Metal-chloride precursor gases may also be provided ex-situ by introducing gallium trichloride, indium trichloride and aluminum trichloride into the reaction chamber.

The precursor gas may include different metal-chloride molecules. The metal-chloride molecule present depends on factors, such as pressure, temperature, as well as the type and amount of gases present in the reaction chamber. For example, the metal-chloride molecules may be in the form of a monochloride molecule (GaCl, AlCl, InCl), chloride monomer ($GaCl_3$, $AlCl_3$, $InCl_3$) and chloride dimer ($Ga_2Cl_6$, $Al_2Cl_6$, $In_2Cl_6$).

However, when it is desired to form gallium nitride, it is generally desirable for the gas to include monochloride molecules instead of chloride monomers and dimers because gallium nitride is more likely to be formed. Gallium nitride is less likely to be formed when the gas includes gallium chloride monomers and/or dimers because gallium monomers and dimers are more likely to gas phase interact. When the gallium chloride monomers and dimers gas phase interact, they are less likely to react with ammonia to form gallium nitride. Thus, the gallium nitride growth rate and the efficiency at which the precursor gases are used both increase in response to having the gas include more monochloride molecules, and fewer monomer and dimer molecules.

The metal-chloride molecules often change from one type of molecule to another in response to semiconductor growth parameters, such as changes in pressure, temperature, as well as the type and amount of gases present in the reaction chamber. For example, gallium chloride at low temperatures forms a chloride dimer ($Ga_2Cl_6$) that decomposes into a chloride monomer ($GaCl_3$) at an intermediate temperature, and into gallium monochloride (GaCl) at higher temperatures. Aluminum chloride and indium chloride molecules change in the same way as gallium chloride molecules in response to temperature changes. The change of the metal-, chloride molecules from one type of molecule to another is not easily controllable. Hence, it is desirable to determine and control the type and amount of the metal-chloride gas molecules in a gas in response to changing the growth parameters.

There have been several attempts to determine the type and amount of metal-chloride gas molecules in a gas. More information may be found in U.S. Pat. Nos. 5,070,246 and 5,652,431, as well as U.S. Patent Application No. 20080124453, the contents of all of which are incorporated herein by reference. Information may also be found in an article by Laubengayer et al., which was published in the Journal of the American Chemical Society, page 1578, volume 62 in 1940 and in an article by Kuniya et al., which was published in the Journal of Crystal Growth, page 385, volume 28 in 1975.

BRIEF SUMMARY OF THE INVENTION

The present invention provides a semiconductor growth system which includes a chamber and a source of electromagnetic radiation. A detector is arranged to detect absorption of radiation from the source by a chloride-based chemical of the chamber. The chamber may comprise a reaction chamber and side chamber. A control system controls the operation of the chamber in response to the absorption of radiation by the chloride-based chemical. The control system controls the operation of the chamber by adjusting a parameter of the chamber. The chloride-based chemical is typically in the form of a monochloride molecule, chloride monomer and chloride dimer. The radiation absorbed may have a wavelength in many different wavelength ranges, such as between about 100 nanometers and 400 nanometers.

In some embodiments, the control system controls the operation of the chamber in response to the absorption of radiation by a monochloride molecule, chloride monomer and chloride dimer of the chloride-based chemical. The control system may control the operation of the chamber by adjusting the amount of monochloride molecules, chloride monomers and chloride dimers of the chloride-based chemical. The control system may adjust the amount of monochloride molecules, chloride monomers and chloride dimers of the chloride-based chemical of the chamber by adjusting its temperature.

The present invention provides a semiconductor growth system which includes a chamber having an inner volume and a chloride-based chemical in the inner volume. The semiconductor growth system includes a first source of electromagnetic radiation, and a first detector is arranged to detect absorption of radiation by the chloride-based chemical. The radiation absorbed may have a wavelength in many different wavelength ranges, such as between about 100 nanometers and 350 nanometers. A control system controls the operation of the chamber in response to a first indication from the first detector. The first indication typically corresponds to the type and amount of chloride-based chemicals in a first region of the inner volume. The control system may adjust one or more of the operating parameters of the chamber in response to the first indication.

In some embodiments, the semiconductor growth system includes a second source of electromagnetic radiation and a second detector arranged to detect absorption of radiation of the second source by the chloride-based chemical. The first and second detectors are typically positioned at different locations. The control system may control the operation of the chamber in response to a second indication from the second detector. The second indication typically corresponds to the type and amount of chloride-based chemicals in a second region of the inner volume. The control system may adjust one or more of the operating parameters of the chamber in response to the second indication.

The present invention provides a method of forming a semiconductor which includes radiating electromagnetic radiation through an inner volume of a chamber and detecting absorption of the radiation by a chloride-based chemical of the chamber. The radiation absorbed may have different wavelength ranges. In one embodiment, the wavelength is in a range between about 100 nanometers and 400 nanometers. In another embodiment, the wavelength is in a range between about 185 nanometers and 210 nanometers. The method includes controlling the operation of the chamber in response to the absorption of the radiation. The chloride-based chemical is typically in the form of a monochloride molecule, chloride monomer and chloride dimer.

In some embodiments, the method includes controlling the operation of the chamber with the control system by adjusting a growth parameter of the chamber, for example, in response to the absorption of radiation by the monochloride molecule, chloride monomer and chloride dimer of the chloride-based chemical. In some embodiments, the method includes controlling the operation of the chamber with the control system by adjusting the amount of monochloride molecules, chloride monomers and chloride dimers of the chloride-based chemical. The control system may adjust the amount of monochloride molecules, chloride monomers and chloride dimers of the chloride-based chemical of the chamber by adjusting its temperature.

Further features and advantages of the invention will be apparent to those skilled in the art from the following detailed description, taken together with the accompanying drawings.

DETAILED DESCRIPTION OF THE INVENTION

Figure 1A:
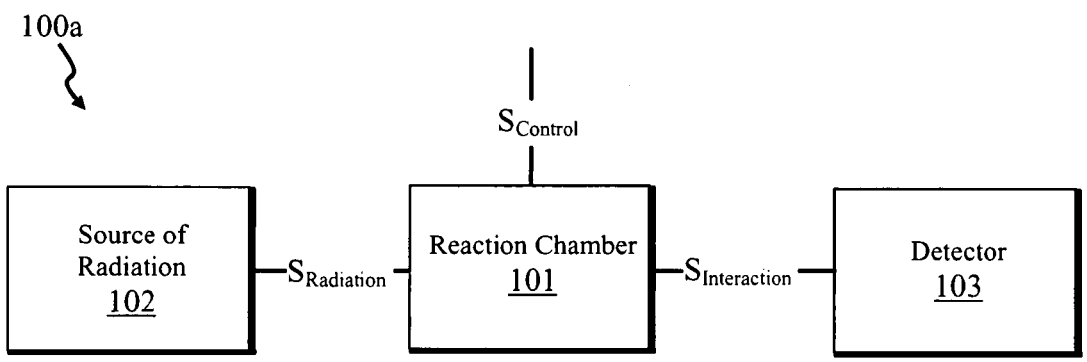
FIG. 1a is a block diagram of a semiconductor growth system, in accordance with the invention.

The invention involves determining and controlling the type and amount of chloride-based chemicals present in a gas of a chamber of a semiconductor growth system. The invention also involves employing a technique which allows the control of the chamber in response to the determination of the type and amount of chloride-based chemicals of the gas. The chamber may comprise a reaction chamber (FIGS. 4a-4d) and side chamber (FIG. 4e). The chloride-based chemicals may comprise those used as precursor gases. In this embodiment, the chloride-based chemicals include a metal-chloride based precursor gas. Example of metal-chloride based precursor gases include GaCl, AlCl and InCl. The metal-chloride precursor gases may be in the form of many different metal-chloride molecules, such as a monochloride molecule (GaCl, AlCl, InCl), chloride monomer ($GaCl_3$, $AlCl_3$, $InCl_3$) and chloride dimer ($Ga_2Cl_6$, $Al_2Cl_6$, $In_2Cl_6$).

The semiconductor growth system may include systems such as metallorganic chemical vapor deposition (MOCVD), molecular beam epitaxy (MBE) and hydride (or halide) vapor phase epitaxy (HVPE), among others. More information regarding MOCVD, MBE and HVPE may be found in U.S. Pat. Nos. 6,146,458, 6,194,742, 6,229;150, 6,441,393, 6,521, 917 and 6,900,070, U.S. Patent Application Nos. 20060076559, 20060118513, 20060076559, 20060118513, 20070072324, 20070218703 and 20080124453, the contents of all of which are incorporated herein by reference. Information may also be found in M. A. Mastro et al., "Influence of polarity on GaN thermal Stability", Journal of Crystal Growth, Vol. 274, Pages 38-46 (2005) and M. A. Mastro et al., "Thermal stability of MOCVD and HVPE GaN layers in $H_2$, HCl, $NH_3$ and $N_2$", Physica Status Solidi (a), Vol. 188, No. 1, Pages 467-471 (2001), M. A. Mastro et al., "Influence of polarity on GaN thermal Stability", Journal of Crystal Growth, Vol. 274, Pages 38-46 (2005) and M. A. Mastro et al., "Thermal stability of MOCVD and HVPE GaN layers in $H_2$, HCl, $NH_3$ and $N_2$", Physica Status Solidi (a), Vol. 188, No. 1, Pages 467-471 (2001). The formation of a semiconductor material is often referred to as deposition and growth.

The semiconductor material may comprise III-V semiconductor materials, such as the III-nitrides. Examples of III-nitride semiconductor materials include gallium nitride, indium nitride and aluminum nitride, as well as their corresponding alloys, such as InGaN and AlGaN. More information regarding semiconductor materials may be found in U.S. Pat. Nos. 6,815,309, 6,900,070, 6,908,828 and 6,953,736, as well as U.S. Patent Application Nos. 20060099776, 20070218703 and 20060118513, the contents of all of which are incorporated herein by reference. More information regarding semiconductor materials may also be found in M. Stutzmann et al., Physica Status Solidi (b) 228, No. 2, 505-512 (2001) and E. S. Hellman, MRS Internet Journal of Nitride Semiconductor Research 3, 11 (1998). The semiconductor material is typically formed on a substrate, such as a sapphire and silicon carbide substrate. More information regarding semiconductor substrates may be found in U.S. Pat. Nos. 6,194,742 and 6,441,393, as well as U.S. Patent Application No. 20070072324, the contents of all of which are incorporated herein by reference.

In accordance with the invention, the type and amount of chloride-based chemicals (GaCl, InCl, AlCl) present in a chamber is determined by using a source of electromagnetic radiation and a detector. Further, the type and amount of chloride-based molecules (monochloride molecules, chloride monomer, chloride dimer) present in the chamber is also determined by using the source and detector. The source of electromagnetic radiation may comprise a lamp, laser and light emitting diode. The source may emit many different wavelengths of radiation, such as violet, blue, green, red and infrared radiation, but it typically includes ultraviolet (UV) radiation. The lamp may comprise types, such as Xenon, Tungsten, Deuterium and Deuterium Tungsten lamps, among others. Examples of these types of lamps are disclosed in U.S. Pat. Nos. 6,734,967 and 6,741,348. These types of lamps are provided by manufacturers, such as Heraeus Noblelight, LLC, among others. The laser may comprise types, such as a gas laser and a semiconductor laser. Examples of semiconductor lasers are disclosed in U.S. Pat. Nos. 6,925,101 and 6,954,478, and examples of gas lasers are disclosed in U.S. Pat. Nos. 5,257,278 and 7,288,775. These types of lasers are provided by manufacturers, such as CVI Melles Griot.

The detector may comprise a spectrometer and photodiode. Examples of spectrometers and/or photodiodes are disclosed in U.S. Pat. Nos. 5,394,237, 5,420,432, 5,436,459, 5,703,689, 6,852,997 and 6,980,285. The detector, however, is generally capable of detecting the electromagnetic radiation from the source that interacts with the gas. The electromagnetic radiation may interact with the gas in many different ways. For example, in one embodiment, the electromagnetic radiation of the source interacts with the gas because a portion of it is absorbed by the gas. Hence, in these embodiments, the detector is capable of detecting wavelengths of radiation that correspond with the radiation absorbed by the gas. In some embodiments, the detector is capable of detecting a range of wavelengths of radiation that corresponds with the radiation absorbed by the gas. This process is typically referred to as absorption spectroscopy.

Absorption spectroscopy is useful because it is capable of resolving the wavelength difference between the absorption of radiation by monochloride molecules, chloride dimers and chloride monomers of the gas. For example, the gallium chloride dimer and gallium chloride monomer sometimes absorb radiation at wavelengths of about 195 nm and 200 nm, respectively, so that the difference between them is about 5 nm. Absorption spectroscopy is capable of resolving this 5 nm wavelength difference so that the number of gallium chloride dimers and gallium chloride monomers of the gas may be determined, as will be discussed in more detail below.

Many other types of spectroscopy that may be used. For example, in some embodiments, the invention utilizes emission spectroscopy which determines the range of electromagnetic wavelengths in which the gas emits radiation in response to receiving radiation from the source. In emission spectroscopy, the gas first absorbs short wavelength radiation from the source and emits long wavelength radiation in response. In other embodiments, the invention utilizes scattering spectroscopy, such as Raman spectroscopy, which determines the amount of radiation that the gas scatters at different wavelengths, incident angles, and polarization angles.

In accordance with the invention, a control system is operatively coupled with the chamber, as well as the detector. In some embodiments, the control system is operatively coupled with the source of electromagnetic radiation. The control system controls the operation of the chamber in response to the determination of the type and amount of chloride-based chemicals of the gas. Further, the control system controls the operation of the chamber in response to the type and amount of chloride-based molecules of the gas.

The control system may control the operation of the chamber, such as by controlling the growth parameters, such as those discussed in more detail above. One way the control system controls the operation of the chamber is by adjusting one or more of the growth parameters so that a semiconductor material is formed at a desired rate. The quality of a semiconductor material may be characterized, such as by the number of defects included therein, such as impurities and dislocations.

FIG. 1a is a block diagram of a semiconductor growth system 100a, in accordance with the invention. In this embodiment, semiconductor growth system 100a includes a chamber 101. Semiconductor growth system 100a and chamber 101 may comprise HYPE, MOCVD and MBE as discussed in more detail above.

In this embodiment, semiconductor growth system 100a includes a source 102 of electromagnetic radiation, such as the sources mentioned above. Source 102 emits electromagnetic radiation, denoted as signal $S_{Radiation}$, to chamber 101, wherein the electromagnetic radiation is an optical signal which typically includes UV radiation. Signal $S_{Radiation}$ flows through chamber 101 and interacts with the gases therein, such as the chloride-based chemicals discussed above. In this embodiment, signal $S_{Radiation}$ interacts with the chloride-based chemicals because a portion of it is absorbed by the chloride-based chemicals and another portion of it is not absorbed by the chloride-based chemicals, and a signal $S_{Interaction}$ is provided in response. Hence, in absorption spectroscopy, signal $S_{Interaction}$ is an optical signal which corresponds with signal $S_{Radiation}$ after the portion of signal $S_{Radiation}$ has been absorbed by the chloride-based chemicals. Examples of signals $S_{Interaction}$ and $S_{Radiation}$ in absorption spectroscopy will be discussed in more detail with FIGS. 2a, 2b and 2c and FIGS. 3a, 3b and 3c.

In emission spectroscopy, signal $S_{Interaction}$ is an optical signal which corresponds with signal $S_{Radiation}$ after a portion of signal $S_{Radiation}$ has been absorbed by the chloride-based chemicals and emitted by the chemical species. In scattering spectroscopy, signal $S_{Interaction}$ is an optical signal which corresponds with signal $S_{Radiation}$ after a portion of signal $S_{Radiation}$ has been scattered by the chloride-based chemicals. In emission and scattering spectroscopy, signal $S_{Interaction}$ generally has a smaller wavelength than the electromagnetic radiation in signal $S_{Radiation}$.

Figure 2A:
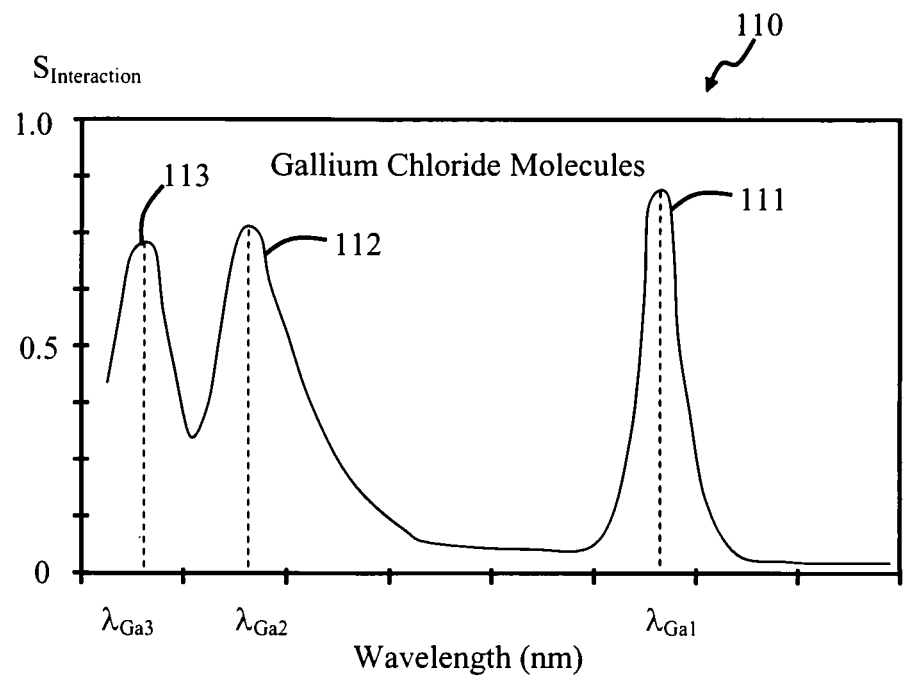
FIGS. 2a, 2b and 2c are absorption spectroscopy graphs of a signal $S_{Interaction}$ verses wavelength corresponding with the interaction of a signal $S_{Radiation}$ with gallium chloride, aluminum chloride and indium chloride molecules, respectively.
Figure 2B:
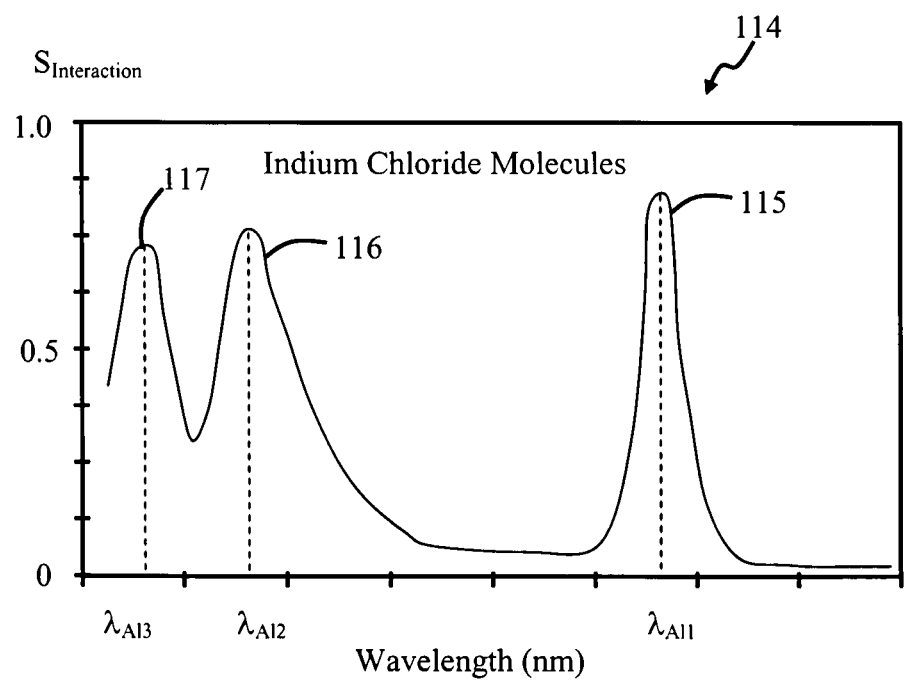
Figure 2C:
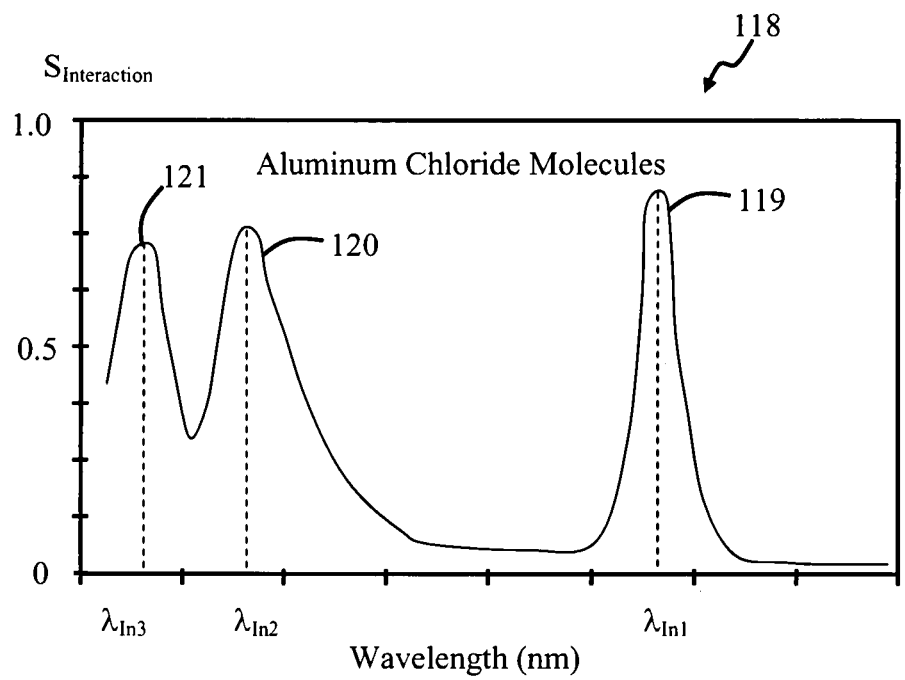

FIGS. 2a, 2b and 2c are absorption spectroscopy graphs 110, 114 and 118, respectively, of signal $S_{Interaction}$ verses wavelength corresponding with the interaction of signal $S_{Radiation}$ with gallium chloride, aluminum chloride and indium chloride. Signal $S_{Interaction}$ is normalized to one in FIGS. 2a, 2b and 2c for illustrative purposes. As mentioned above, these chloride-based chemicals may exist as several different types of molecules, such as monochlorides, chloride monomers and chloride dimers. The monochlorides, chloride monomers and chloride dimers generally absorb radiation at three different wavelengths in response to receiving signal $S_{Radiation}$.

Signal $S_{Interaction}$ may be represented in many different ways. In graphs 110, 114 and 118, signal $S_{Interaction}$ is represented by the absorbance as determined by the Beer-Lambert law, which states that there is a logarithmic dependence between the ratio of signals $S_{Radiation}$ and $S_{Interaction}$ to the product of the absorption cross-section ($\sigma$) of the chloride molecules, the path length (l) between the source and detector and the number density (N) of the chloride molecules. More information regarding the Beer-Lambert law may be found in U.S. Pat. No. 5,070,246.

The wavelengths in FIGS. 2a, 2b and 2c may have different ranges which depend on the structure of the gallium chloride, aluminum chloride and indium chloride molecules. However, it is believed that monochlorides, chloride monomers and chloride dimers of gallium, aluminum and indium generally absorb radiation in a range of wavelengths between about 100 nanometers (nm) and 350 nm. Radiation with a wavelength in a range between about 300 nm and 400 nm is commonly referred to as near ultraviolet (NUV), whereas radiation below about 300 nm is commonly referred to as deep ultraviolet (DUV). It should also be noted that the particular wavelengths that monochloride, monomer and dimer molecules absorb radiation in response to absorbing radiation depends on many different factors, such as the pressure and temperature of the gases in chamber 101, as well as the type and amount of gases present in chamber 101. Hence, in some situations, monochlorides, chloride monomers and chloride dimers of gallium, aluminum and indium may absorb radiation in a range of wavelengths outside of the 100 nanometers (nm) to 350 nm wavelength range.

In FIG. 2a, portions 111, 112 and 113 of graph 110 correspond to GaCl, GaCl$_3$ and Ga$_2$Cl$_6$ molecules absorbing radiation at about wavelengths $\lambda_{Ga1}$, $\lambda_{Ga2}$ and $\lambda_{Ga3}$, respectively, in response to receiving signal $S_{Radiation}$. Wavelength $\lambda_{Ga1}$ is greater than wavelength $\lambda_{Ga2}$, and wavelength $\lambda_{Ga2}$ is greater than wavelength $\lambda_{Ga3}$. Hence, it may be determined, using a detector, the relative amounts of GaCl, GaCl$_3$ and Ga$_2$Cl$_6$ molecules that are present within chamber 101 by determining, using the Beer-Lambert law, the amount of absorption at wavelengths $\lambda_{Ga1}$, $\lambda_{Ga2}$ and $\lambda_{Ga3}$, respectively, in signal $S_{Interaction}$.

In FIG. 2b, portions 115, 116 and 117 of graph 114 correspond to AlCl, AlCl$_3$ and Al$_2$Cl$_6$ molecules absorbing radiation at about wavelengths $\lambda_{A11}$, $\lambda_{A12}$ and $\lambda_{A13}$, respectively, in response to receiving signal $S_{Radiation}$. Wavelength $\lambda_{A11}$ is greater than wavelength $\lambda_{A12}$, and wavelength $\lambda_{A12}$ is greater than wavelength $\lambda_{A13}$. Hence, it may be determined, using a detector, the relative amounts of AlCl, AlCl$_3$ and Al$_2$Cl$_6$ molecules that are present within chamber 101 by determining, using the Beer-Lambert law, the amount of absorption at wavelengths $\lambda_{A11}$, $\lambda_{A12}$ and $\lambda_{A13}$, respectively, in signal $S_{Interaction}$.

In FIG. 2c, portions 119, 120 and 121 of graph 118 correspond to InCl, InCl$_3$ and In$_2$Cl$_6$ molecules absorbing radiation at about wavelengths $\lambda_{In1}$, $\lambda_{In2}$ and $\lambda_{In3}$, respectively, in response to receiving signal $S_{Radiation}$. Wavelength $\lambda_{In1}$ is greater than wavelength $\lambda_{In2}$, and wavelength $\lambda_{In2}$ is greater than wavelength $\lambda_{In3}$. Hence, it may be determined, using a detector, the relative amounts of InCl, InCl$_3$ and In$_2$Cl$_6$ molecules that are present within chamber 101 by determining, using the Beer-Lambert law, the amount of absorption at wavelengths $\lambda_{In1}$, $\lambda_{In2}$ and $\lambda_{In3}$, respectively, in signal $S_{Interaction}$.

In this embodiment, and as shown in FIG. 1a, semiconductor growth system 100a includes a detector 103 which detects signal $S_{Interaction}$. Detector 103 may comprise the spectrometer and photodiodes discussed in more detail above. Detector 103 generally detects desired wavelengths of radiation, or a desired range of wavelengths, by using a control system, as will be discussed in more detail with FIG. 1b.

In one embodiment, detector 103 detects radiation having wavelengths of $\lambda_{Ga1}$, $\lambda_{Ga2}$ and $\lambda_{Ga3}$ (FIG. 2a) so that the control system may determine the relative amounts of GaCl, GaCl$_3$ and Ga$_2$Cl$_6$ molecules that are present within chamber 101 by determining the amount of absorption at wavelengths $\lambda_{Ga1}$, $\lambda_{Ga2}$ and $\lambda_{Ga3}$, respectively, in signal $S_{Interaction}$.

In another embodiment, detector 103 detects radiation having wavelengths of $\lambda_{A11}$, $\lambda_{A12}$ and $\lambda_{A13}$ (FIG. 2b) so that the control system may determine the relative amounts of AlCl, AlCl$_3$ and Al$_2$Cl$_6$ molecules that are present within chamber 101 by determining the amount of absorption at wavelengths $\lambda_{A11}$, $\lambda_{A12}$ and $\lambda_{A13}$, respectively, in signal $S_{Interaction}$.

In another embodiment, detector 103 detects radiation having wavelengths of $\lambda_{In1}$, $\lambda_{In2}$ and $\lambda_{In3}$ (FIG. 2c) so that the control system may determine the relative amounts of InCl, InCl$_3$ and In$_2$Cl$_6$ molecules that are present within chamber 101 by determining the amount of absorption at wavelengths $\lambda_{In1}$, $\lambda_{In2}$ and $\lambda_{In3}$, respectively, in signal $S_{Interaction}$.

Detector 103 may detect radiation at selected wavelengths. For example, in some embodiments, detector 103 detects radiation at all of wavelengths $\lambda_{Ga1}$, $\lambda_{Ga2}$, $\lambda_{Ga3}$, $\lambda_{A11}$, $\lambda_{A12}$, $\lambda_{A13}$, $\lambda_{In1}$, $\lambda_{In2}$ and/or $\lambda_{In3}$, as well as wavelengths in between. In other embodiments, detector 103 detects radiation at some of wavelengths $\lambda_{Ga1}$, $\lambda_{Ga2}$, $\lambda_{Ga3}$, $\lambda_{A11}$, $\lambda_{A12}$, $\lambda_{A13}$, $\lambda_{In1}$, $\lambda_{In2}$ and/or $\lambda_{In3}$. In general, detector 103 detects radiation at one or more wavelengths corresponding to the molecule(s) it is desired to detect.

The control system may be used to determine the relative amounts of the molecules of the chloride-based chemicals that are present in chamber 101 by using the Beer-Lambert law. For example, the control system may determine the amount of absorption corresponding to portions 111, 112 and 113 of graph 110, and use the Beer-Lambert law to determine the number density (N) of the different gallium chloride molecules. In this way, the control system may determine the relative amounts of GaCl, GaCl$_3$ and Ga$_2$Cl$_6$ that are present in chamber 101. Further, the control system may determine the amount of absorption corresponding to portions 115, 116 and 117 of graph 114, and use the Beer-Lambert law to determine the number density (N) of the different aluminum chloride molecules. In this way, the control system may determine the relative amounts of AlCl, AlCl$_3$ and Al$_2$Cl$_6$ that are present in chamber 101. The control system may determine the amount of absorption corresponding to portions 119, 120 and 121 of graph 118, and use the Beer-Lambert law to determine the number density (N) of the different indium chloride molecules. In this way, the control system may determine the relative amounts of InCl, InCl$_3$ and In$_2$Cl$_6$ that are present in chamber 101.

In this embodiment, and as shown in FIG. 1a, a control signal, denoted, as $S_{Control}$, is provided to chamber 101. Signal $S_{Control}$ is provided to chamber 101 in response to detector 103 receiving signal $S_{Interaction}$ and the control system determining the number density (N) of the chloride molecules, as described above. In accordance with the invention, the operation of chamber 101 is controlled in response to signal $S_{Control}$. The operation of chamber 101 may be controlled such as, for example, the temperature of chamber 101 may be adjusted in response to signal $S_{Control}$, as will be discussed in more detail below. The temperature of chamber 101 corresponds with the temperature of the gases of chamber 101, such as the metal-chloride based gas. Hence, the temperature of the gases of chamber 101 increase and decrease in response to the temperature of chamber 101 increasing and decreasing, respectively.

Figure 3A:
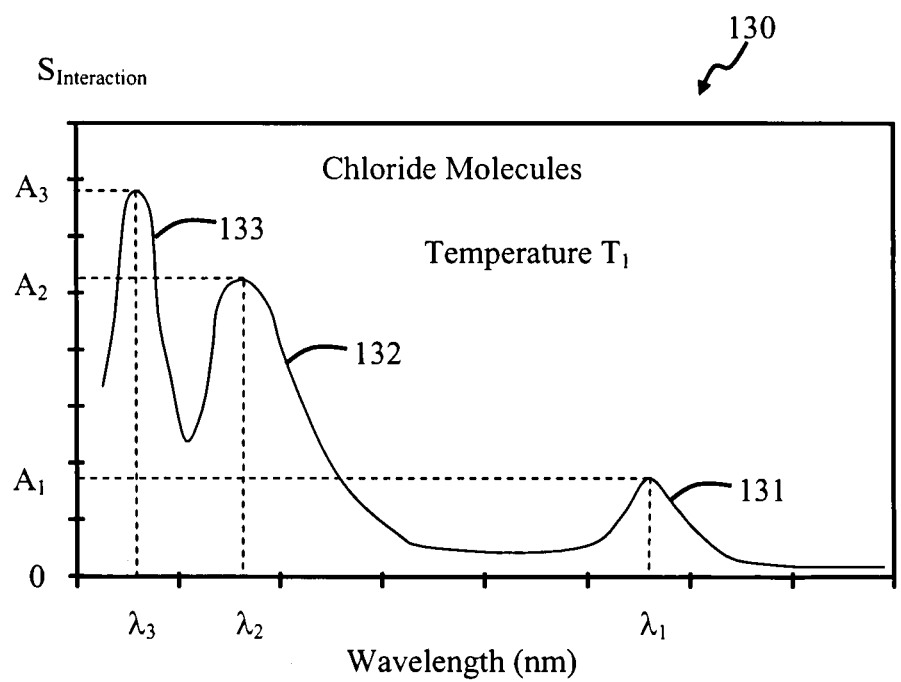
FIGS. 3a, 3b and 3c are graphs of signal $S_{Interaction}$ verses wavelength corresponding with the interaction of signal $S_{Radiation}$ with a monochloride molecule, chloride monomer and chloride dimer at different temperatures.
Figure 3B:
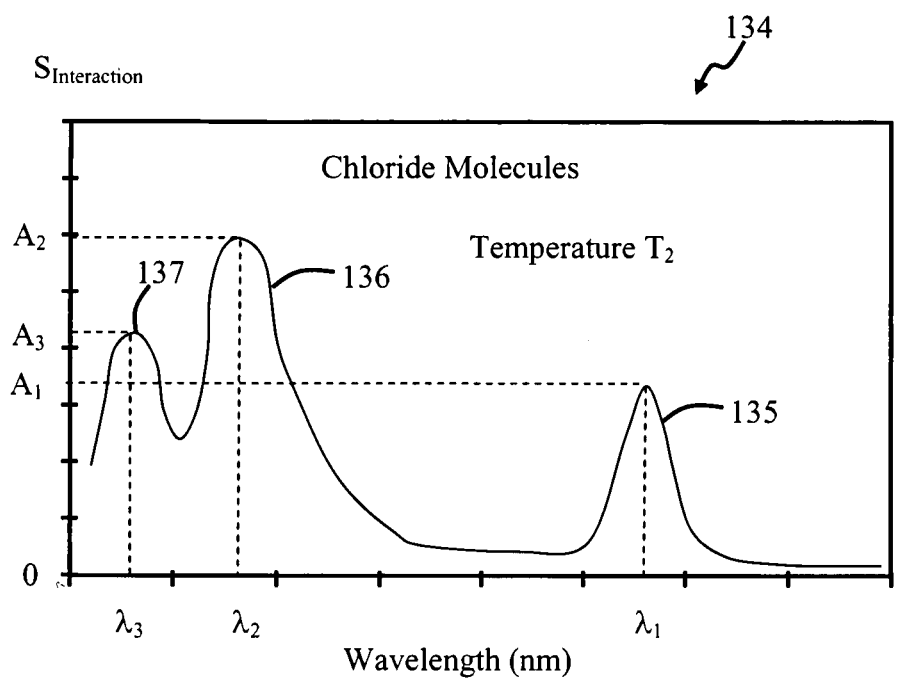
Figure 3C:
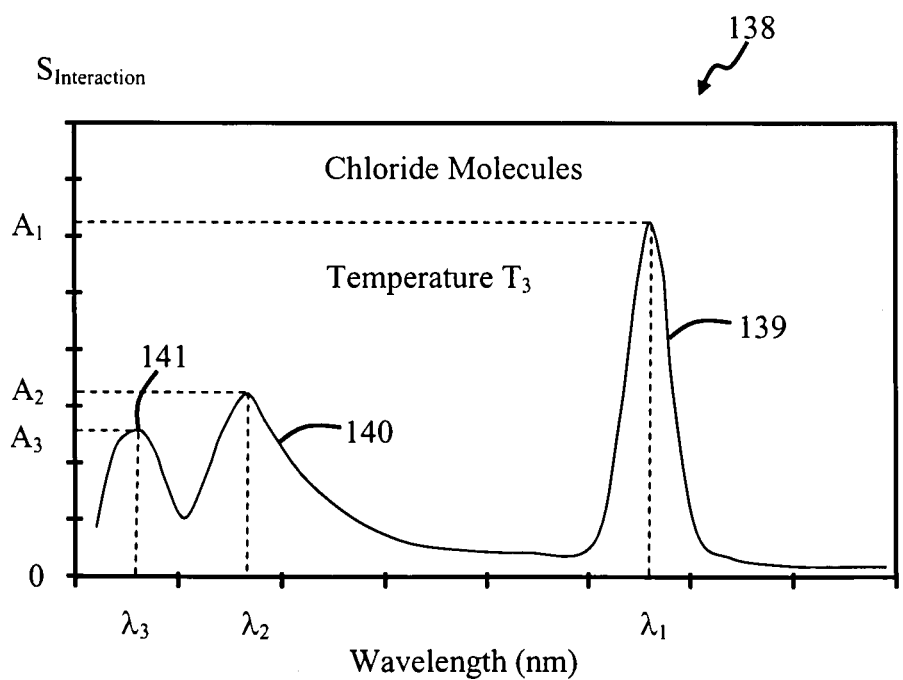

FIGS. 3a, 3b and 3c are graphs 130, 134 and 138, respectively, of signal $S_{Interaction}$ verses wavelength corresponding with the interaction of signal $S_{Radiation}$ with a monochloride molecule, chloride monomer and chloride dimer at different temperatures. Graphs 130, 134 and 138 are for temperatures $T_1$, $T_2$ and $T_3$, respectively, wherein temperature $T_1$ is less than temperature $T_2$, and temperature $T_2$ is less then temperature $T_3$. Temperatures $T_1$, $T_2$ and $T_3$ may have many different temperature values. In general, temperatures $T_1$, $T_2$ and $T_3$ have values within a range of temperatures of about 50° C. and about 950° C., although, in some situations, temperatures $T_1$, $T_2$ and $T_3$ may have values outside of this range. In one situation, temperatures $T_1$, $T_2$ and $T_3$ have values within a range of temperatures of about 50° C. and about 1300° C.

In general, as the temperature of the gas of chamber 101 increases, the amount of monochloride molecules increases, and the amount of chloride monomers and chloride dimers decrease. Further, as the temperature of the gas of chamber 101 decreases the amount of chloride monomers and dimers increase, and the amount of monochloride molecules decreases. Hence, in accordance with the invention, the temperature of chamber 101 is adjusted in response to signal $S_{Control}$ to drive the amount of monochlorides, chloride monomers and chloride dimers of the gas of chamber 101 to desired amounts. In one example, the temperature of chamber 101 is adjusted in response to signal $S_{Control}$ to drive the amounts of monochlorides, chloride monomers and chloride dimers of the gas of chamber 101 to desired amounts relative to each other.

For example, in FIG. 3a, portion 133 of graph 130 corresponds with the absorbance of the chloride dimers, which has an absorbance of $A_3$ at a wavelength $\lambda_3$. Further, portions 132 and 131 of graph 130 correspond with the absorbance of the chloride monomers and monochloride molecules, respectively, at corresponding wavelengths of wavelength $\lambda_2$ and $\lambda_1$. The chloride monomer and monochloride molecule have absorbances of $A_2$ and $A_1$, respectively, at corresponding wavelengths $\lambda_2$ and $\lambda_1$. Wavelength $\lambda_1$ is greater than wavelength $\lambda_2$, and wavelength $\lambda_2$ is greater than wavelength $\lambda_3$. Further, absorbance $A_3$ is greater than absorbance $A_2$, and absorbance $A_2$ is greater than absorbance $A_1$. The number (N) of monochloride molecules, chloride monomers and chloride dimers correspond with the values of absorbances $A_1$, $A_2$ and $A_3$, respectively, through the Beer-Lambert law. Hence, at temperature $T_1$, the number of chloride dimers is typically greater than the number of chloride monomers because absorbance $A_3$ is greater than absorbance $A_2$. Further, the number of chloride monomers is typically greater than the number of monochloride molecules because absorbance $A_2$ is greater than absorbance $A_1$. It should be noted, however, that absorbances $A_1$, $A_2$ and $A_3$ depend on the absorption cross-section ($\sigma$) of the monochloride molecule, chloride monomer and chloride dimer, respectively.

In FIG. 3b, portions 135, 136 and 137 of graph 134 correspond with the absorbance of the monochloride molecules, chloride monomers and chloride dimers, respectively, of FIG. 3a at temperature $T_2$. As mentioned above, temperature $T_2$ is greater than temperature $T_1$, so that absorbance $A_2$ is greater than absorbance $A_3$, and absorbances $A_2$ and $A_3$ are greater than absorbance $A_1$. Hence, at temperature $T_2$, the number of chloride monomers is greater than the number of chloride dimers because absorbance $A_2$ is greater than absorbance $A_3$. Further, the number of chloride monomers and dimers are each greater than the number of monochloride molecules because absorbances $A_2$ and $A_3$ are each greater than absorbance $A_1$.

The values of absorbances $A_1$ and $A_2$ of graph 134 are greater than the corresponding values of absorbances $A_1$ and $A_2$ of graph 130, which indicates that the number of monochloride molecules and monomer chlorides increased in response to the temperature increasing from $T_1$ to $T_2$. Further, the value of absorbance $A_3$ of graph 130 is greater than the value of absorbance $A_3$ of graph 134, which indicates that the number of chloride dimers decreased in response to the temperature increasing from $T_1$ to $T_2$.

In FIG. 3c, portions 139, 140 and 141 of graph 138 corresponds with the absorbance of the monochloride molecules, chloride monomers and chloride dimers, respectively, of FIG. 3a at temperature $T_3$. As mentioned above, temperature $T_3$ is greater than temperature $T_2$, so that absorbance $A_1$ is greater than absorbance $A_2$, and absorbances $A_1$ and $A_2$ are each greater than absorbance $A_3$. Hence, at temperature $T_3$, the number of monochloride molecules is greater than the number of chloride monomers because absorbance $A_1$ is greater than absorbance $A_2$. Further, the number of monochloride molecules and chloride monomers are each greater than the number of chloride dimers because absorbances $A_1$ and $A_2$ are each greater than absorbance $A_3$.

The value of absorbance $A_1$ of graph 138 is greater than the corresponding value of absorbance $A_1$ of graph 134, which indicates that the number of monochloride molecules increased in response to the temperature increasing from $T_2$ to $T_3$. Further, the values of absorbances $A_2$ and $A_3$ of graph 134 are greater than the values of absorbances $A_2$ and $A_3$ of graph 138, which indicates that the number of chloride monomers and dimers decreased in response to the temperature increasing from $T_2$ to $T_3$. Hence, FIGS. 3a, 3b and 3c illustrate that the number of monochloride molecules, chloride monomers and chloride dimers of the gas may be adjusted relative to each other by adjusting the temperature of the gas.

The temperature is driven from temperature $T_1$ to temperature $T_2$ and then to temperature $T_3$ in this example for illustrative purposes to show how the number of monochloride molecules, chloride monomers and chloride dimers may be adjusted. However, in other situations, the number of monochloride molecules, chloride monomers and chloride dimers may be adjusted by driving the temperature from temperature $T_3$ to temperature $T_2$ and then to temperature $T_1$. In general, when the temperature is driven from temperature $T_1$ to temperature $T_2$ and then to temperature $T_3$, the number of monochloride molecules decrease and the number of chloride monomers and chloride dimers increase. In this way, the temperature may be increased and decreased in response to signal $S_{Control}$ to drive the amount of monochlorides, chloride monomers and chloride dimers that are present within chamber 101 to desired amounts.

The pressure of the metal-chloride based gas of chamber 101 may be adjusted in response to signal $S_{Control}$. For example, the pressure of the metal-chloride based gas of chamber 101 may be adjusted by providing more of it in chamber 101, thereby increasing the pressure. Further, the pressure of the metal-chloride based gas may be decreased by providing less of it in chamber 101. As discussed in more detail above, the metal-chloride based gas may be provided to chamber 101 ex-situ or in-situ. The amount of chloride monomers is typically increased when the metal-chloride gas is provided ex-situ to the reaction chamber because most metal-chloride gas sources are gases of chloride monomers.

The operation of chamber 101 may also be controlled by adjusting the type and amount of other gases present in chamber 101. For example, control system 106 may allow more of one gas, such as a growth gas (AsH$_3$, NH$_3$, PH$_3$, Ga(CH$_3$)$_3$, Al$_2$(CH$_3$)$_6$, In(CH$_3$)$_3$), into chamber 101 and reduce the amount of another growth gas (AsH$_3$, NH$_3$, PH$_3$, Ga(CH$_3$)$_3$, Al$_2$(CH$_3$)$_6$, In(CH$_3$)$_3$) that is allowed into chamber 101. In this way, control system 106 may adjust the relative amounts of different precursor gases in chamber 101. Control signal S$_{Control}$ may be provided to chamber 101 in many different ways to control its operation, one of which will be discussed in more detail presently.

Figure 1B:
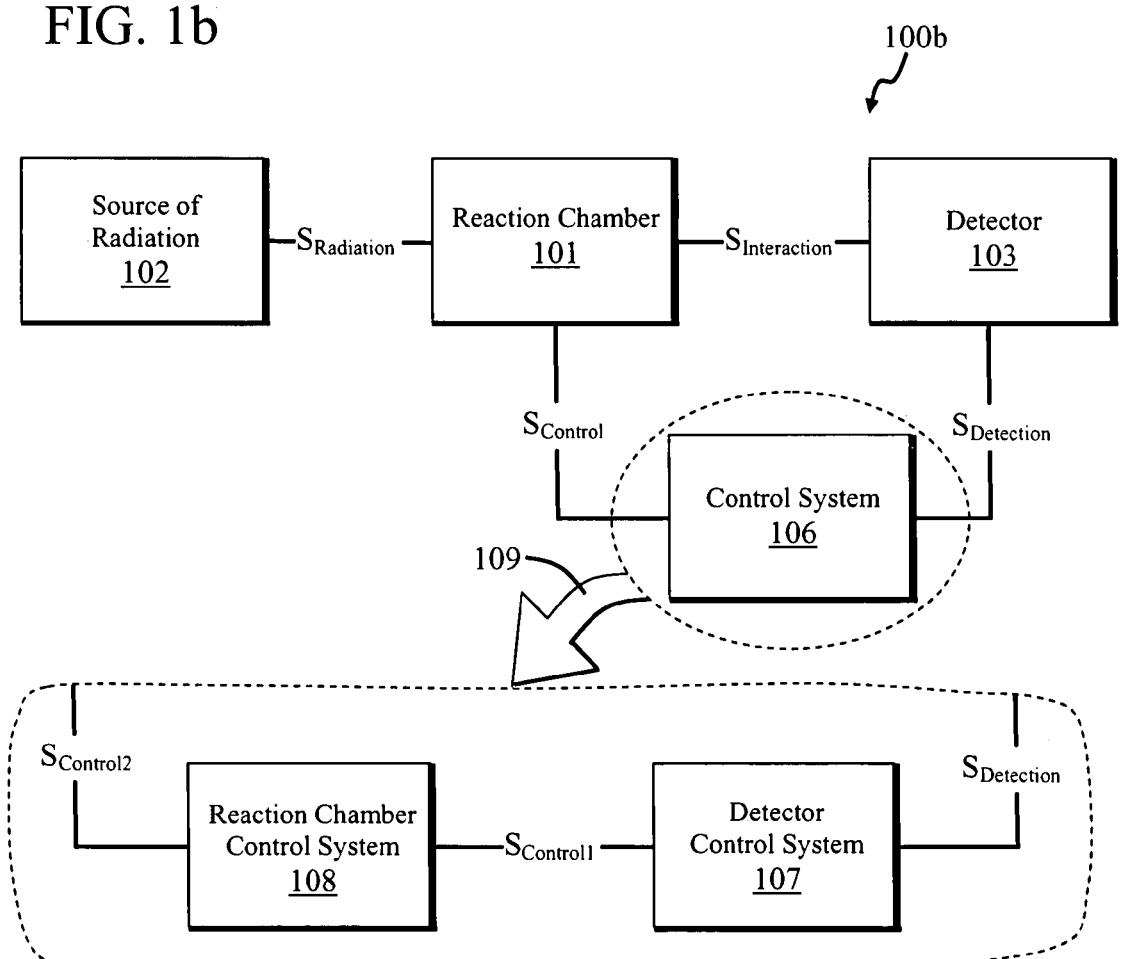
FIG. 1b is a block diagram of another embodiment of a semiconductor growth system, in accordance with the invention.

FIG. 1b is a block diagram of a semiconductor growth system 100b, in accordance with the invention. In this embodiment, semiconductor growth system 100b includes system 100a, as described in more detail with FIG. 1a. Further, semiconductor growth system 100b includes a control system 106 operatively coupled to detector 103 and chamber 101. Control system 106 is operatively coupled to detector 103 and chamber 101 so it may control their operation. For example, control system 106 is operatively coupled to detector 103 so it controls the wavelengths of radiation that detector 103 detects. Further, control system 106 is operatively coupled to chamber 101 to control the growth parameters, as described above.

Control system 106 may be of many different types, such as a computer that operates software. Hence, the software operated by control system 106 may operate chamber 101 and detector 103. Control system 106 may be provided with different types of input to control the operation of chamber 101. For example, a user may provide an indication of a desired type and amount of gas in chamber 101, and control system 106 may control the operation of reaction chamber 106 to drive the gases therein to the desired type and amount. Further, a user may provide an indication of a desired growth parameter of gas in chamber 101, and control system 106 may control the operation of reaction chamber 106 to drive the growth parameter to the desired growth parameter.

Control system 106 may be operatively coupled with source 102 to control its operation, if desired. It should also be noted that control system 106 typically processes data. For example, control system 106 may determine the relative intensities of different wavelengths of radiation detected by detector 103 to provide an indication, using the Beer-Lambert law, of the relative amounts of the monochloride, monomer and dimer molecules present in chamber 101. Further, control system 106 may determine the values of A$_1$, A$_2$ and A$_3$.

In operation, detector 103 provides a detector signal S$_{Detection}$ to control system 106, wherein detector signal S$_{Detection}$ corresponds to signal S$_{Interaction}$. For example, in some embodiments, signal S$_{Detection}$ is an electrical signal that corresponds to optical signal S$_{Interaction}$. Further, control system 106 controls the operation of chamber 101, as described above, by providing control signal S$_{Control}$ to chamber 101 in response to receiving signal S$_{Detection}$ from detector 103. Hence, semiconductor growth system 100b is operated through a closed-loop which includes chamber 101, detector 103 and control system 106.

Control system 106 may be a single control system or separate control systems operatively coupled together. For example, as indicated by a substitution arrow 109, control system 106 may be replaced with a detector control system 107 operatively coupled with a reaction chamber control system 108. In the example indicated by arrow 109, detector signal S$_{Detection}$ flows between detector 103 and detector control system 107, a control signal S$_{Control1}$ flows between detector control system 107 and reaction chamber control system 108 and a control signal S$_{Control2}$ flows between reaction chamber control system 108 and chamber 101.

In operation, detector 103 provides detector signal S$_{Detection}$ to detector control system 107, and detector control system 107 provides signal S$_{Control1}$ to reaction chamber control system 108 in response. Further, reaction chamber control system 108 provides a control signal S$_{Control2}$ to chamber 101. The operation of chamber 101 is controlled, as described above, in response to control signal S$_{Control2}$.

Figure 4A:
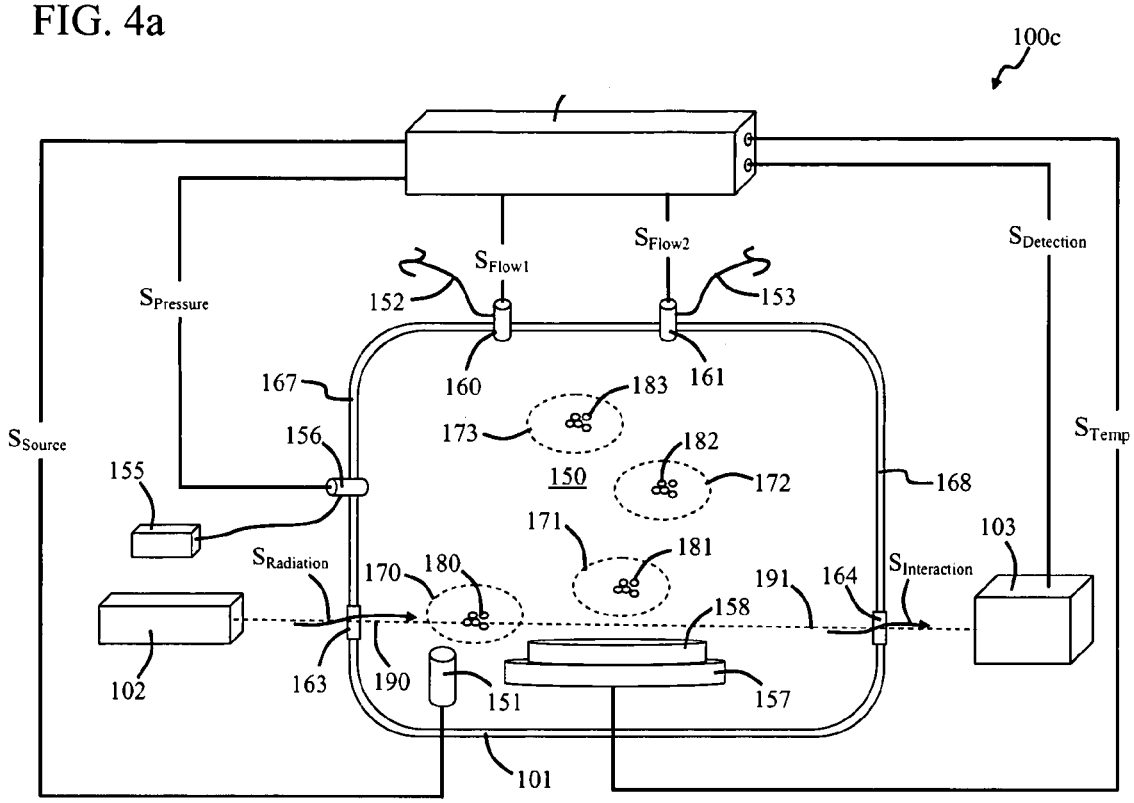
FIGS. 4a, 4b, 4c, 4d and 4e are perspective views of different embodiments of a semiconductor growth system, in accordance with the invention.

FIG. 4a is a perspective view of a semiconductor growth system 100c, in accordance with the invention. In this embodiment, semiconductor growth system 100c includes chamber 101 with an inner volume 150. Further, semiconductor growth system 100c includes a precursor source 151 positioned in inner volume 150, and gas lines 152 and 153 in fluid communication with inner volume 150 through flow controllers 160 and 161, respectively. Semiconductor growth system 100c includes a vacuum system 155 in fluid communication with inner volume 150 through a vacuum valve 156.

Flow controllers 160 and 161 control the flow of gas from corresponding gas lines 152 and 153 into inner volume 150. The gas provided by gas lines 152 and 153 may comprise precursor gases as discussed above (AsH$_3$, NH$_3$, PH$_3$, Ga(CH$_3$)$_3$, Al$_2$(CH$_3$)$_6$, In(CH$_3$)$_3$). Flow controllers 160 and 161 may comprise typical flow controllers used in the semiconductor industry to control the flow of gas in a semiconductor growth system. These types of flow controllers are sometimes referred to as mass flow controllers (MFC).

Precursor source 151 provides a precursor gas to inner volume 150, wherein the gas typically includes metal-chloride molecules (GaCl, InCl, AlCl). The precursor gas provided by source 151 is typically formed by flowing hydrogen chloride over a molten metal so that the hydrogen chloride and molten metal interact with each other. The precursor gas is formed in response to the interaction of the hydrogen chloride and molten metal. For example, to form gallium chloride, indium chloride and aluminum chloride, hydrogen chloride is flowed over molten gallium, indium and aluminum, respectively. The amount of the precursor gas provided by precursor source 151 may be controlled such as by controlling the temperature of the molten metal, and by controlling the amount of chloride gas which flows over the molten metal. Vacuum system 155 operates to control the pressure of the gas in inner volume 150 through vacuum valve 156. Vacuum system 155 may be of many different types, but here it is of the type typically used in semiconductor growth systems.

In this embodiment, semiconductor growth system 100c includes a heater 157 which provides heat to control the temperature of a substrate 158 in inner volume 150, as well as to control the temperature of chamber 101 and the gas within inner volume 150. Heater 157 may comprise for example, filaments, solid state lamps, as well as resistive and inductive heating elements. In some embodiments, a plurality of heaters 157 are positioned external to chamber 101 and provide heat through chamber 101 to substrate 158.

In this embodiment, flow controllers 160, 161 and 155, as well as heater 157 and precursor source 151, are operatively coupled to control system 106. In this way, control system 106 controls the operation of controllers 160, 161 and 155, heater 157, vacuum system 155 and precursor source 151. For example, control system 106 provides signals S$_{Flow1}$ and S$_{Flow2}$ to flow controllers 160 and 161, respectively, to adjust the amount of gas which is allowed to flow from corresponding gas lines 152 and 153 to inner volume 150. Hence, control system 106 operates as a gas controller. Further, control system 106 provides a signal S$_{Temp}$ to heater 157 to adjust its temperature. Hence, control system 106 operates as a temperature controller. Control system 106 provides a signal S$_{Pressure}$ to vacuum controller 155 so that vacuum system 155 adjusts the pressure of the gas of inner volume 150. Hence, control system 106 operates as a pressure controller. Control system 106 provides signal $S_{Source}$ to precursor source 151 and, in response, precursor source 151 provides a desired amount of precursor gas into inner volume 150. In this embodiment, signal $S_{Source}$ controls the temperature of the molten metal of precursor source 151, and the amount of hydrogen chloride flowing over the molten metal is controlled with signal $S_{Pressure}$. Signals $S_{Flow1}$, $S_{Flow2}$, $S_{Temp}$, $S_{Pressure}$ and $S_{Source}$ are generally included in the control signals of FIGS. 1a and FIG. 1b, such as $S_{Control}$ and $S_{Control2}$.

In accordance with the invention, semiconductor growth system 100c includes source 102 and detector 103 optically coupled together through inner volume 150. Source 102 and detector 103 may be operatively coupled together in number of ways. In this embodiment, chamber 101 includes windows 163 and 164 which allow signals $S_{Radiation}$ and $S_{Interaction}$, respectively, to flow between a volume outside chamber 101 and inner volume 150. In this way, source 102 and detector 103 are operatively coupled together through inner volume 150 and windows 163 and 164. Windows 163 and 164 may comprise quartz and fused silica. In some embodiments, chamber 101 also includes materials such as quartz and fused silica. In these embodiments, windows 164 and 164 are typically an integral component of chamber 101 and do not require further processing to allow the transmission of electromagnetic radiation therethrough. In some embodiments, chamber 101 may require polishing in areas where the windows are to be located.

Semiconductor growth system 100c may include optical devices to facilitate the flow of signals $S_{Radiation}$ and $S_{Interaction}$. For example, one or more optical lenses may be positioned between source 102 and window 163, and/or between detector 103 and window 164. In some examples, one or more optical filters are positioned between source 102 and window 163, and/or between detector 103 and window 164. Further, signal $S_{Radiation}$ may be flowed from source 101 to window 163 using an optical waveguide, such as an optical fiber and light pipe. Signal $S_{Interaction}$ may be flowed from window 164 to detector 103 using an optical waveguide.

In some embodiments, the portion of optical path 190 between source 102 and window 163 and the portion of optical path 191 between window 164 and detector 103 extend through an ambient gas, wherein the ambient gas is selected to reduce the attenuation of signals $S_{Radiation}$ and $S_{Interaction}$. For example, the ambient gas may include more nitrogen and less oxygen when $S_{Radiation}$ includes UV radiation because UV radiation is not attenuated as much by nitrogen as it is by oxygen. Hence, oxygen absorbs more UV radiation than nitrogen so it is desirable to reduce the amount of oxygen between source 102 and window 163, and between window 164 and detector 103.

Detector 103 is operatively coupled with control system 106 so that signal $S_{Detection}$ may flow between them. As discussed in more detail above with FIGS. 1a and 1b, signal $S_{Radiation}$ is provided by source 102 and interacts with the gases, such as the metal-chloride based gases and the chemical species, of chamber 101 (i.e. within inner volume 150). Signal $S_{interaction}$ is provided in response to the interaction of signal $S_{Radiation}$ with the gases, and signal $S_{Interaction}$ is detected by detector 103.

In this embodiment, source 102 is aligned so that its optical path 190 extends through window 163 and inner volume 150. Further, detector 103 is aligned so that its optical path 191 extends through window 164 and inner volume 150. In this way, source 102 may provide signal $S_{Radiation}$ through window 163 and detector 103 receives signal $S_{Interaction}$ through window 164. Optical paths 190 and 191 may be oriented relative to each other in a number ways depending on factors, such as the type of spectroscopy being used.

In this embodiment, optical paths 190 and 191 are oriented so they are aligned with each other, which is useful for absorption spectroscopy. Optical paths 190 and 191 are aligned with each other so that they extend between source 102 and detector 103. In this way, source 102 directs signal $S_{Radiation}$ towards window 164 and detector 103.

In this embodiment, optical paths 190 and 191 extend through a region 170 of inner volume 150 which is proximate to precursor source 151. Hence, gas molecules 180 in region 170 interact with signal $S_{Radiation}$ and provide signal $S_{Interaction}$ to detector 103 along optical path 191. In this way, source 102 and detector 103 are optically coupled together through the interaction of signal $S_{Radiation}$ with gas molecules 180. Since region 170 is proximate to precursor source 151, gas molecules 180 correspond with those provided by precursor source 151. Thus, signal $S_{Interaction}$ corresponds with the number and type of chemical species provided by precursor source 151.

It should be noted, however, that optical paths 190 and 191 may be oriented so they extend through other regions of inner volume 150. For example, windows 163 and 164 may be positioned so that optical paths 190 and 191 are oriented so they extend through a region 171, which is proximate to a growth surface of substrate 158. In this way, gas molecules 181 in region 171 interact with signal $S_{Radiation}$ and provide signal $S_{Interaction}$ to detector 103 along optical path 191. Since region 171 is proximate to the growth surface of substrate 158, gas molecules 181 correspond with the chemical species that agglomerate on substrate 158. Thus, signal $S_{Interaction}$ corresponds with the number and type of chemical species that are proximate to substrate 158.

In one example, windows 163 and 164 are positioned so that optical paths 190 and 191 are oriented so they extend through a region 173, which is proximate to flow controllers 160 and 161. In this way, gas molecules 183 in region 173 interact with signal $S_{Radiation}$ and provide signal $S_{Interaction}$ to detector 103 along optical path 191. Since region 173 is proximate to flow controllers 160 and 161, gas molecules 183 correspond with the gases that are proximate to flow controllers 160 and 161. Thus, signal $S_{Interaction}$ corresponds with the number and type of gases that are proximate to flow controllers 160 and 161. In another example, windows 163 and 164 are positioned so that optical paths 190 and 191 are oriented so they extend through a region 172, which is between substrate 158 and flow controllers 160 and 161. In this way, gas molecules 182 in region 172 interact with signal $S_{Radiation}$ and provide signal $S_{Interaction}$ to detector 103 along optical path 191. Since region 172 is between substrate 158 and flow controllers 160 and 161, gas molecules 182 correspond with the gases that are between substrate 158 and flow controllers 160 and 161. Thus, signal $S_{Interaction}$ corresponds with the number and type of gases that are between substrate 158 and flow controllers 160 and 161.

The orientation of optical paths 190 and 191 may be adjusted in many different ways so they extend through a desired region of inner volume 150. For example, windows 163 and 164 may be positioned at desired positions along opposed sidewalls 167 and 168. Further, source 102 and detector 103 may be oriented at desired angles relative to chamber 101 and windows 163 and 164, respectively, so that corresponding optical paths 190 and 191 extend through the desired region of inner volume 150.

In operation, control system 106 operates flow controllers 160 and 161 with corresponding signals $S_{Flow1}$ and $S_{Flow2}$ so they flow a desired type and amount of gas into inner volume 150 through gas lines 152 and 153, respectively. Further, control system 106 operates heater 157 with signal $S_{Temp}$ to drive it to a desired temperature to heat substrate 158, as well as the gases provided by flow controllers 160 and 161 and precursor source 151. The gases decompose into chemical species, such as those discussed in more detail above. The chemical species interact and form the semiconductor layer on substrate 158.

In accordance with the invention, source 102 provides signal $S_{Radiation}$ through window 163, as described in more detail above, and signal $S_{Radiation}$ interacts with gas molecules 180 so that signal $S_{Interaction}$ is provided. Signal $S_{Interaction}$ flows through window 164 and is detected by detector 103, and detector 103 provides signal $S_{Detection}$ to control system 106 in response. Control system 106 receives signal $S_{Detection}$ and determines the type and amount of gas molecules 180 in region 170, such as by using the Beer-Lambert law as discussed above with FIGS. 2a, 2b and 2c. In response to this determination, control system 106 adjusts the operation of chamber 101 to drive the gas molecules within region 170 to be a desired type and amount of gas molecules. The desired type and amount of gas molecules within region 170 may be provided to control system 106 in a number ways, such as, for example a user may provide the desired type and amount of gas molecules to control system 106 by using an input device, such as a keyboard or mouse, operatively coupled with control system 106.

As discussed above, control system 106 may adjust the operation of chamber 101 to drive the gas molecules within region 170 to be a desired type and amount of gas molecules in many different ways. For example, if signal $S_{Detection}$ indicates that the amount of dimer molecules of gas molecules 180 is too large relative to the amount of monochloride molecules of gas molecules 180, control system 106 provides signal $S_{Temp}$ to heater 157 to increase its temperature. In response, the temperature of gas molecules 180 increases so that a number of dimer molecules of gas molecules 180 decompose into monomer molecules, and a number of monomer molecules of gas molecules 180 decompose into monochloride molecules. In this way, the relative amounts of monochloride, monomer and dimer molecules of gas molecules 180 in region 170 may be controlled.

In another example, if signal $S_{Detection}$ indicates that the amount of monochloride molecules of gas molecules 180 is too large relative to the amount of dimer molecules of gas molecules 180, control system 106 provides signal $S_{Temp}$ to heater 157 to decrease its temperature. In response, the temperature of gas molecules 180 in region 170 decreases so that a number of monochloride molecules of gas molecules 180 combine to form monomer molecules, and a number of monomer molecules of gas molecules 180 combine to form dimer molecules. Hence, the number of monochloride, monomer and dimer molecules of gas molecules 180 in region 170 may be adjusted relative to each other, as discussed above with FIGS. 3a, 3b and 3c, by adjusting the temperature of heater 157. In this way, the relative amounts of monochloride, monomer and dimer of gas molecule's 180 in region 170 may be controlled.

Another way control system 106 may adjust the operation of chamber 101 to drive gas molecules 180 within region 170 to be a desired type and amount of gas molecules is by controlling the operation of flow controllers 160 and 161, as well as precursor source 151. For example, if signal $S_{Detection}$ indicates that the amount of gas provided by gas line 152 is too low in region 173, control system 106 provides signal $S_{Flow1}$ to flow controller 160 and, in response, flow controller 160 allows more gas from gas line 152 to flow into inner volume 150 so the amount of the gas in region 173 is increased.

In another example, if signal $S_{Detection}$ indicates that the amount of gas provided by gas line 152 is too high in region 173, control system 106 provides signal $S_{Flow1}$ to flow controller 160 and, in response, flow controller 160 allows more gas from gas line 152 to flow into inner volume 150 so the amount of the gas in region 173 is decreased. In this way, control system 106 adjusts the operation of chamber 101 to drive the gas molecules within region 173 to be a desired type and amount of gas molecules by controlling the operation of flow controller 160. In this embodiment, control system 106 controls the operation of flow controller 161 in the same manner.

If signal $S_{Detection}$ indicates that the amount of gas provided by precursor source 151 is too low in region 170, control system 106 provides signal $S_{Source}$ to precursor source 151 and, in response, precursor source 151 provides more precursor gas into region 170 of inner volume 150 so the amount of precursor gas in region 170 is increased. Further, if signal $S_{Detection}$ indicates that the amount of gas provided by precursor source 151 is too high in region 170, control system 106 provides signal $S_{Source}$ to precursor source 151 and, in response, precursor source 151 provides less precursor gas into region 170 of inner volume 150 so the amount of precursor gas in region 170 is decreased. In this way, control system 106 adjusts the operation of chamber 101 to drive the gas molecules within region 170 to be a desired type and amount of gas molecules by controlling the operation of precursor source 151. As mentioned above, precursor source 151 typically provides a gas which includes metal-chloride molecules, such as monochloride molecules (GaCl, AlCl, InCl), monomer molecules ($GaCl_3$, $AlCl_3$, $InCl_3$) and dimer molecules ($Ga_2Cl_6$, $Al_2Cl_6$, $In_2Cl_6$), wherein the metal-chloride molecules are provided to inner volume 150 by precursor source 151 in-situ.

Control system 106 may adjust the operation of chamber 101 by controlling the pressure of the gas in inner volume 150 to be a desired pressure. For example, if signal $S_{Detection}$ indicates that the amount of gas provided by gas lines 152 and 153 and precursor source is too low in inner volume 150, control system 106 provides signal $S_{Pressure}$ to vacuum controller 155 so that vacuum system 155 flows less gas out of inner volume 150. The pressure of the gas in inner volume 150 increases in response to less of the gas being flowed out of inner volume 150.

In another example, if signal $S_{Detection}$ indicates that the amount of gas provided by gas lines 152 and 153 and precursor source is too high in inner volume 150, control system 106 provides signal $S_{Pressure}$ to vacuum controller 155 so that vacuum system 155 flows more gas out of inner volume 150. The pressure of the gas in inner volume 150 decreases in response to more of the gas being flowed out of inner volume 150. In this way, control system 106 may adjust the pressure of the gas in inner volume 150.

Figure 4B:
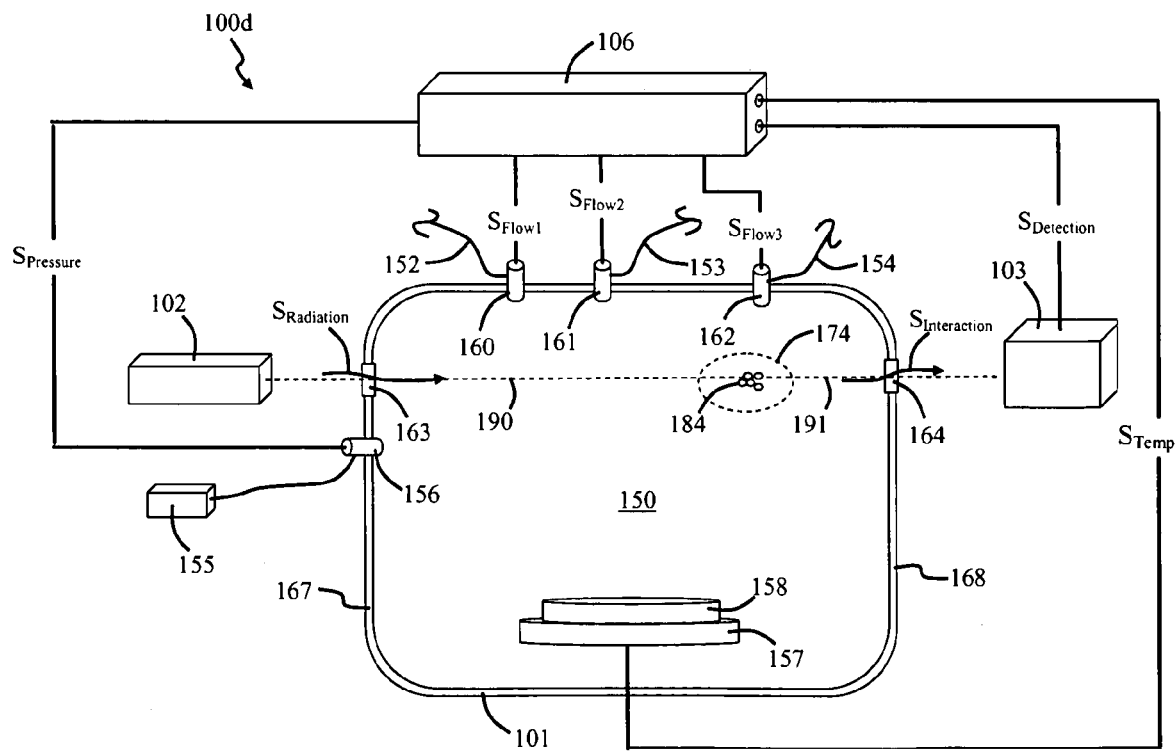

FIG. 4b is a perspective view of a semiconductor growth system 100d, in accordance with the invention. In this embodiment, semiconductor growth system 100d includes chamber 101 with inner volume 150. Further, gas lines 152 and 153 are in fluid communication with inner volume 150 through flow controllers 160 and 161, respectively. In this embodiment, gas line 154 is in fluid communication with inner volume 150 through flow controller 162, wherein gas line 154 provides a precursor gas ex-situ to inner volume 150.

In accordance with the invention, windows 163 and 164 and source 102 and detector 103 are positioned so that optical paths 190 and 191 extend through a region 174 of inner volume 150, wherein region 174 is proximate to flow controller 162. In this way, gas molecules 184 in region 174 interact with signal $S_{Radiation}$ and provide signal $S_{Interaction}$ to detector 103 along optical path 191. Since region 174 is proximate to flow controller 162, gas molecules 184 correspond with the precursor gas that is provided by flow controller 162. Thus, signal $S_{Interaction}$ corresponds with the number and type of metal-chloride molecules that are provided by flow controller 162.

In operation, control system 106 operates flow controllers 160, 161 and 162 with corresponding signals $S_{Flow1}$, $S_{Flow2}$ and $S_{Flow3}$ so they flow a desired type and amount of gas into inner volume 150 through gas lines 152, 153 and 154, respectively. As mentioned above, flow controllers 161, 162 and 163 generally provide precursor gases. Further, control system 106 operates heater 157 with signal $S_{Temp}$ to drive it to a desired temperature to heat substrate 158, as well as the gases provided by flow controllers 160, 161 and 162. The gases decompose into chemical species, such as those discussed in more detail above. The chemical species interact and form the semiconductor layer on substrate 158.

In accordance with the invention, source 102 provides signal $S_{Radiation}$ through window 163, as described in more detail above, and signal $S_{Radiation}$ interacts with gas molecules 184 so that signal $S_{Interaction}$ is provided. Signal $S_{Interaction}$ flows through window 164 and is detected by detector 103, and detector 103 provides signal $S_{Detection}$ to, control system 106 in response. Control system 106 receives signal $S_{Detection}$ and determines the type and amount of gas molecules 184 in region 174, such as by using the Beer-Lambert law as discussed above with FIGS. 2a, 2b and 2c. In response to this determination, control system 106 adjusts the operation of chamber 101 to drive the gas molecules within region 174 to be a desired type and amount of gas molecules. Control system 106 may adjust the operation of chamber 101 to drive the gas molecules within region 174 to be a desired type and amount of gas molecules in many different ways, such as those discussed in more detail above with FIG. 4a.

Figure 4C:
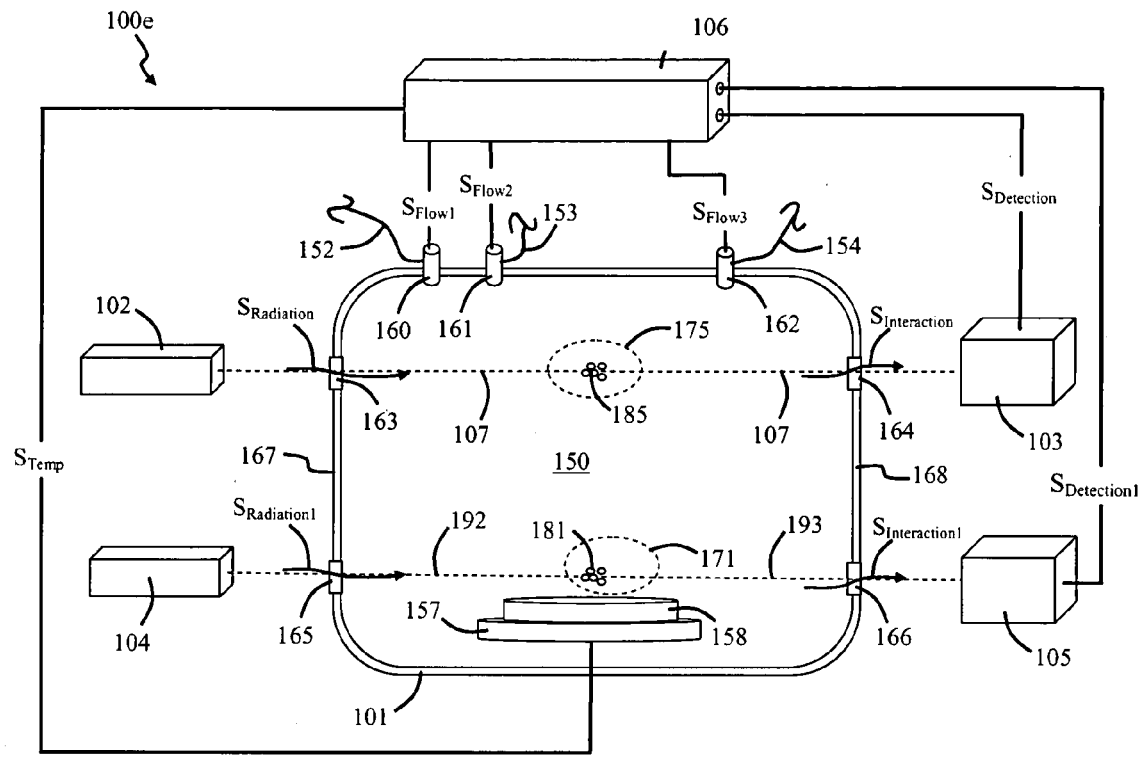

FIG. 4c is a perspective view of a semiconductor growth system 100e, in accordance with the invention. In this embodiment, semiconductor growth system 100e includes semiconductor growth system 100d of FIG. 4b. In accordance with the invention, semiconductor growth system 100e further includes windows 165 and 166, as well as a source 104 and detector 105. Source 104 provides radiation $S_{Radiation1}$ and detector 103 detects signal $S_{Interaction1}$. Source 104 and detector 105 have optical paths 192 and 193, respectively, which are positioned so that they extend through region 171 of inner volume 150, wherein region 171 is proximate to substrate 158. In this way, gas molecules 181 in region 171 interact with signal $S_{Radiation1}$ and provide signal $S_{Interaction1}$ to detector 105 along optical path 193. Since region 171 is proximate to substrate 158, gas molecules 181 correspond with the chemical species that interact on substrate 158. Thus, signal $S_{Interaction1}$ corresponds with the number and type of chemical species that are proximate to substrate 158.

Sources 102 and 104 may provide the same wavelengths of electromagnetic radiation. For example, signals $S_{Radiation}$ and $S_{Radiation1}$ may both correspond with UV radiation. In other embodiments, however, sources 102 and 104 may provide different wavelengths of electromagnetic radiation. For example, signals $S_{Radiation}$ and $S_{Radiation1}$ may correspond with UV and violet radiation, respectively.

In operation, control system 106 operates flow controllers 160, 161 and 162 with corresponding signals $S_{Flow1}$, $S_{Flow2}$ and $S_{Flow3}$ so they flow a desired type and amount of gas into inner volume 150 through gas lines 152, 153 and 154, respectively, as discussed in more detail with FIG. 4b. In accordance with the invention, source 102 provides signal $S_{Radiation}$ through window 163, as described in more detail above, and signal $S_{Radiation}$ interacts with gas molecules 185 so that signal $S_{Interaction}$ is provided. Signal $S_{Interaction}$ flows through window 164 and is detected by detector 103, and detector 103 provides signal $S_{Detection}$ to control system 106 in response. Control system 106 receives signal $S_{Detection}$ and determines the type and amount of gas molecules 185 in region 175, such as by using the Beer-Lambert law as discussed above with FIGS. 2a, 2b and 2c.

In accordance with the invention, source 104 provides signal $S_{Radiation1}$ through window 165 and signal $S_{Radiation1}$ interacts with gas molecules 181 so that signal $S_{Interaction1}$ is provided. Signal $S_{Interaction1}$ flows through window 166 and is detected by detector 105, and detector 105 provides signal $S_{Detection1}$ to control system 106 in response. Control system 106 receives signal $S_{Detection1}$ and determines the type and amount of gas molecules 181 in region 171, such as by using the Beer-Lambert law as discussed above with FIGS. 2a, 2b and 2c.

In response to the determination of the type and amount of gas molecules 181 and 185, control system 106 adjusts the operation of chamber 101 to drive the gas molecules within regions 171 and 175 to be a desired type and amount of gas molecules, as discussed above with FIGS. 3a, 3b and 3c. Control system 106 may adjust the operation of chamber 101 to drive the gas molecules within regions 171 and 175 to be a desired type utilizing methods such as those discussed in more detail above with FIG. 4a.

Figure 4D:
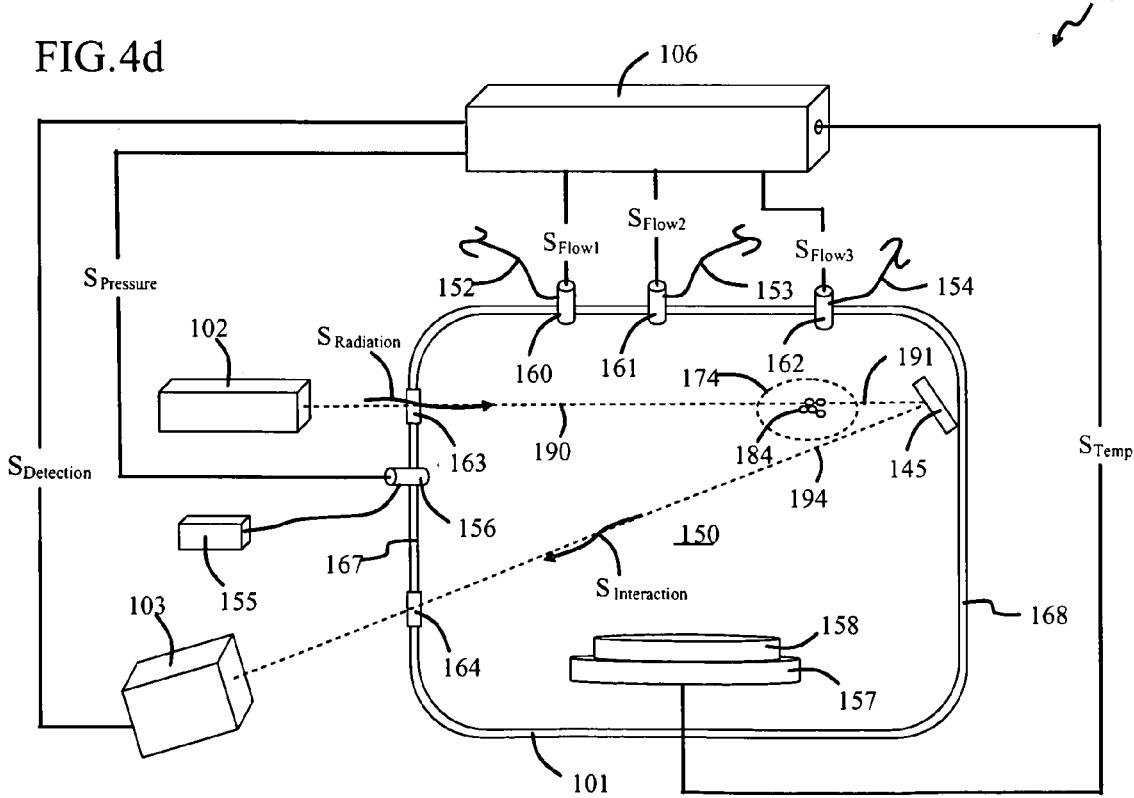
Figure 4E:
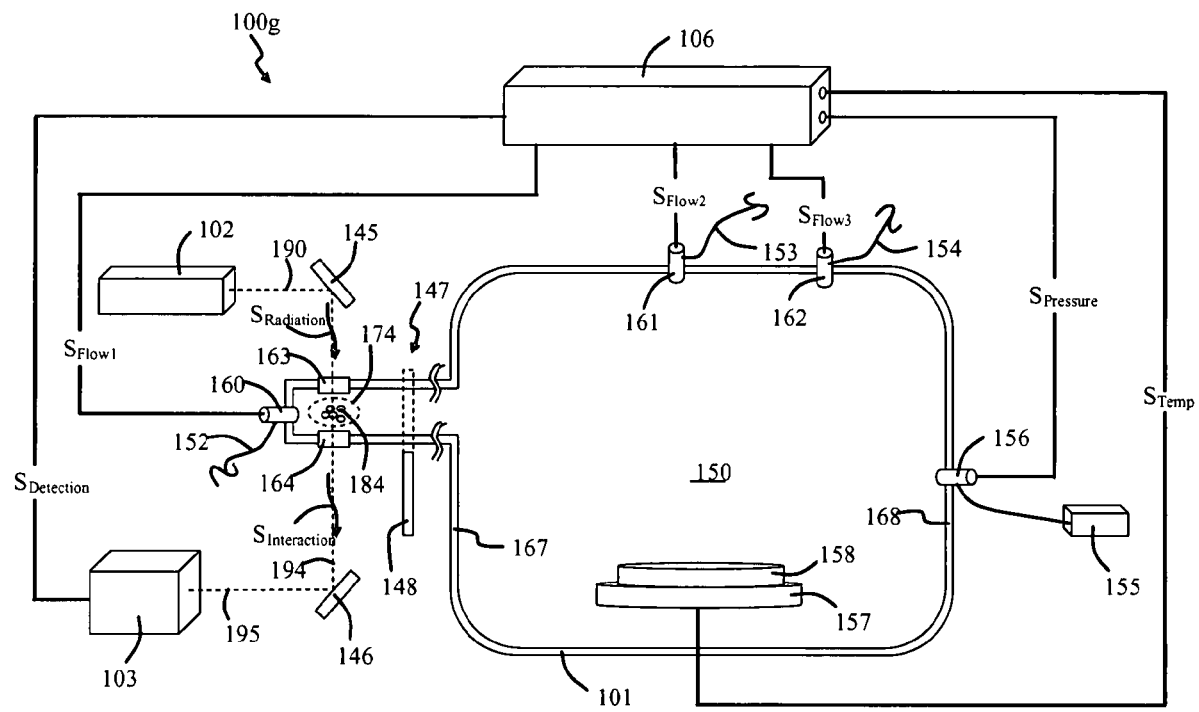

FIG. 4d is a perspective view of a semiconductor growth system 100f, in accordance with the invention. In this embodiment, semiconductor growth system 100f includes semiconductor growth system 100d of FIG. 4b, wherein windows 163 and 164 extend through sidewall 167. Semiconductor growth system 100f includes a mirror 145 positioned within inner volume 150, wherein optical path 190 extends through window 163 and between source 102 and chemical species 184 in region 174. Further, optical path 191 extends between chemical species 184 and mirror 145. In this embodiment, an optical path 194 extends through window 164 and between mirror 145 and detector 103. Hence, mirror 145 directs light flowing along optical path 191 to detector 103 along optical path 194. In this way, source 102 and detector 103 are operatively coupled together through inner volume 150 and windows 163 and 164, as well as mirror 145.

In operation, source 102 provides signal $S_{Radiation}$ through window 163 along optical path 190 wherein it interacts with chemical species 184, and signal $S_{Interaction}$ is provided along optical path 191 in response. Signal $S_{Interaction}$ flows along optical path 191 wherein it is reflected by mirror 145 and directed along optical path 194 towards detector 103. Signal $S_{Interaction}$ flows along optical path 194 through window 164 and to detector 103. More information regarding the operation of semiconductor growth system 100f is provided above with the discussion of semiconductor growth system 100d of FIG. 4b.

FIG. 4e is a perspective view of a semiconductor growth system 100g, in accordance with the invention. In this embodiment, semiconductor growth system 100g includes semiconductor growth system 100d of FIG. 4b. Semiconductor growth system 100f includes a side chamber 147 which extends from sidewall 167. In this embodiment, windows 163 and 164 extend through opposed sides of side chamber 147 and flow controller 160 extends through an end of side chamber 147. In this way, flow controller 160 flows gas from gas line 152 to inner volume 150 through side chamber 147. The gas from gas line 152 is represented as chemical species 184, which is shown as being in region 174, as well as in side chamber 147. It is typically desirable to have windows 163 and 164 positioned away from sidewall 167 so that chemical species 184 is monitored away from reaction chamber 101.

In this embodiment, semiconductor growth system 100g includes a side chamber door 148 which is repeatably moveable between open and closed positions. Side chamber door 148 may comprise a load lock door and valve. Load lock doors and valves are often included in semiconductor growth systems to facilitate the loading of samples into a low pressure environment. More information regarding load lock doors and valves may be found in U.S. Pat. Nos. 4,418,646, 4,534,314 and 6,059,507, the contents of all of which are incorporated herein by reference. When side chamber door 148 is in the open position, as shown by the solid line in FIG. 4e, side chamber 147 is in fluid communication with inner volume 150. When side chamber door 148 is in the closed position, as shown by the dotted line in FIG. 4e, side chamber 147 is not in fluid communication with inner volume 150.

In this embodiment, semiconductor growth system 100g includes mirrors 145 and 146, which are positioned external to inner volume 150 and chamber 101. Optical path 190 extends between mirror 145 and source 102, and optical path 194 extends through windows 163 and 164, as well as side chamber 147, and between mirrors 145 and 146. Further, an optical path 195 extends between mirror 146 and detector 103. In this way, mirror 145 is positioned to direct light from source 102 through windows 163 and 164, and mirror 146 is positioned to direct light that flowed through windows 163 and 164 to detector 103.

In operation, source 102 provides signal $S_{Radiation}$ along optical path 190 wherein it is reflected by mirror 145 and directed to mirror 146 through windows 163 and 164, as well as side chamber 147. Signal $S_{Radiation}$ interacts with chemical species 184 in side chamber 147, and signal $S_{Interaction}$ is provided along optical path 194 in response. Signal $S_{Interaction}$ flows along optical path 194 wherein it is reflected by mirror 146 and directed along optical path 195 towards detector 103. More information regarding the operation of semiconductor growth system 100f is provided above with the discussion of semiconductor growth system 100d of FIG. 4b.

Signal $S_{Radiation}$ may interact with chemical species 184 in side chamber 147 when side chamber door 148 is in the open or closed position. When side chamber door 148 is in the open position, signal $S_{Radiation}$ interacts with chemical species 184 wherein chemical species 184 is internal to reaction chamber 101 because side chamber 147 is in fluid communication with inner volume 150. When side chamber door 148 is in the closed position, signal $S_{Radiation}$ interacts with chemical species 184 wherein chemical species 184 is external to reaction chamber 101 because side chamber 147 is not in fluid communication with inner volume 150. In this way, detector 103 may detect radiation from a chemical species that is internal and external to reaction chamber 101.

It is useful to move side chamber door 148 between the open and closed positions, for example, in some situations it is desirable to detect radiation from chemical species 184 at a particular time, so it may be desirable to reduce the amount chemical species 184 changes at this particular time by moving side chamber door 148 to the closed position so that chemical species 184 is restricted from flowing between side chamber 147 and inner volume 150. In other situations, it is desirable to detect radiation from chemical species 184 as a function of time, so it may be desirable to move side chamber door 148 to the open position so that chemical species 184 may flow between side chamber 147 and inner volume 150.

In still other situations, it may be desirable to move side chamber door 148 to the closed position at a particular time $t_1$ to detect radiation from chemical species 184 in side chamber 147. After a time $t_2$, side chamber door 148 is moved to the open position, wherein side chamber door 148 is in the open position until a time $t_3$. After time $t_3$, side chamber door 148 is moved to the closed position and radiation from chemical species 184 in side chamber 147 is detected. The steps of opening and closing side chamber door 148 and detecting radiation from chemical species 184 may be repeated, as desired. Time $t_3$ is greater than time $t_2$, and time $t_2$ is greater than time $t_1$.

Figure 5A:
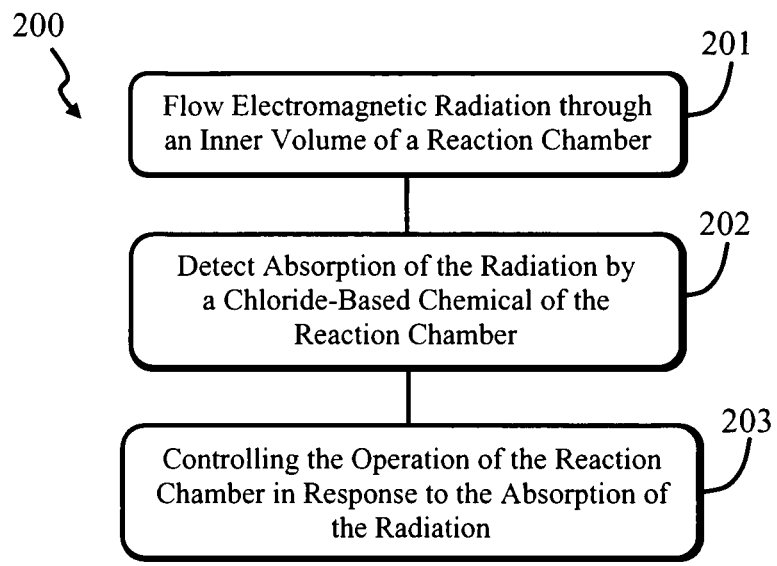
FIGS. 5a and 5b are flow diagrams of a method, in accordance with the invention, of forming a semiconductor.

FIG. 5a is a flow diagram of a method 200, in accordance with the invention. In this embodiment, method 200 includes a step 201 of flowing electromagnetic radiation through an inner volume of a reaction chamber and a step 202 of detecting absorption of the radiation by a chloride-based chemical of the reaction chamber. Method 200 includes controlling the operation of the reaction chamber in response to the absorption of the radiation by the chloride-based chemical. The chloride-based chemical is typically in the form of a monochloride molecule, chloride monomer and/or chloride dimer.

The radiation absorbed may have a wavelength in many different wavelength ranges. For example, in some embodiments, the radiation absorbed has a wavelength between about 100 nanometers and 400 nanometers. In some embodiments, the radiation absorbed has a wavelength between about 100 nanometers and 350 nanometers. In one particular embodiment, the radiation absorbed has a wavelength between about 185 nanometers and 210 nanometers.

Method 200 may include many other steps. For example, in some embodiments, method 200 includes adjusting a growth parameter of the reaction chamber by adjusting the operation of the reaction chamber with the control system. Further, method 200 may include controlling the operation of the reaction chamber with the control system in response to the absorption of radiation by the monochloride molecules, chloride monomers and/or chloride dimers of the chloride-based chemical. In some embodiments, method 200 includes adjusting the amount of monochloride molecules, chloride monomers and chloride dimers of the chloride-based chemical by adjusting the operation of the reaction chamber with the control system. The control system may adjust the amount of monochloride molecules, chloride monomers and chloride dimers of the chloride-based chemical of the reaction chamber by adjusting a growth parameter of the reaction chamber, such as its temperature.

Figure 5B:
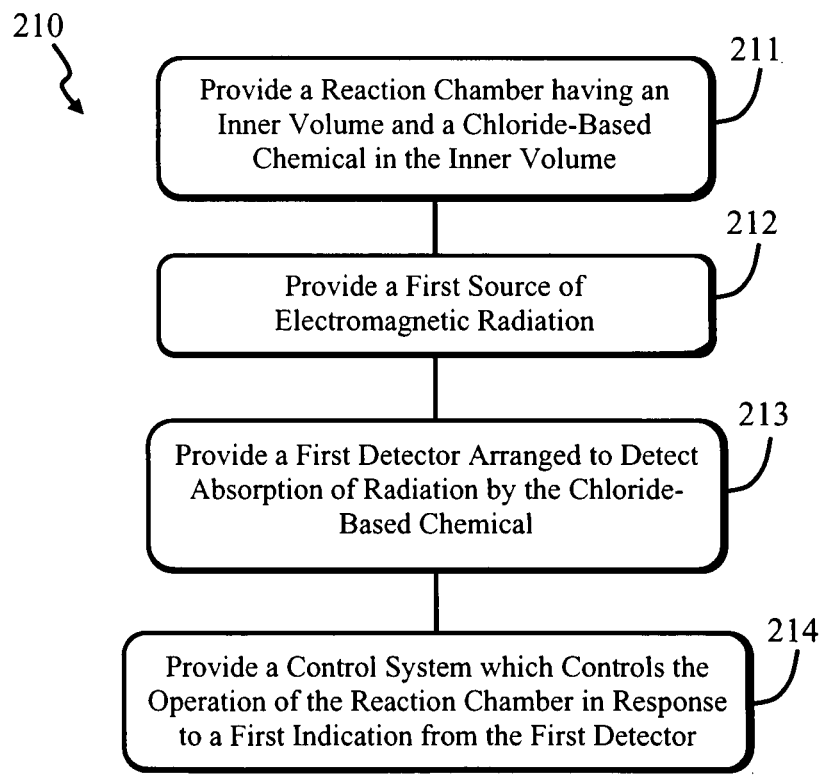

FIG. 5b is a flow diagram of a method 210, in accordance with the invention. In this embodiment, method 210 includes a step 211 of providing a reaction chamber having an inner volume and a chloride-based chemical in the inner volume and a step 212 of providing a first source of electromagnetic radiation. Method 210 includes a step 213 of providing a first detector arranged to detect absorption of radiation by the chloride-based chemical and a step 214 of providing a control system which controls the operation of the reaction chamber in response to a first indication from the first detector. The first indication corresponds to the absorption of radiation by the chloride-based chemical. In this way, the first indication corresponds to the type and amount of chloride-based chemicals in a first region of the inner volume.

Method 210 may include many other steps. For example, in some embodiments, method 210 includes a step of adjusting one or more of the operating parameters of the reaction chamber with the control system in response to the first indication.

In some embodiments, method 210 includes a step of providing a second source of electromagnetic radiation and a second detector arranged to detect absorption of radiation by the chloride-based chemical. The first and second detectors are typically positioned at different locations. The control system controls the operation of the reaction chamber in response to a second indication from the second detector. The second indication typically corresponds to the type and amount of chloride-based chemicals in a second region of the inner volume. The control system may adjust one or more of the operating parameters of the reaction chamber in response to the second indication.

While particular embodiments of the invention have been shown and described, numerous variations and alternate embodiments will occur to those skilled in the art. Accordingly, it is intended that the invention be limited only in terms of the appended claims.

What is claimed is:

1. A method of forming a semiconductor, comprising:
   radiating electromagnetic radiation through an inner volume of a chamber;
   detecting absorption of the radiation by a chloride-based chemical of the chamber; and
   controlling operation of the chamber in response to the absorption of the radiation.

2. The method of claim 1, wherein the chloride-based chemical includes at least one of monochloride molecule, chloride monomer or chloride dimer.

3. The method of claim 1, further including adjusting a growth parameter of the chamber by adjusting the operation of the chamber with a control system.

4. The method of claim 3, further including controlling the operation of the chamber with the control system in response to the absorption of radiation by at least one of the monochloride molecule, chloride monomer or chloride dimer of the chloride-based chemical.

5. The method of claim 1, further including adjusting an amount of the monochloride molecules, chloride monomers or chloride dimers of the chloride-based chemical by adjusting the operation of the chamber with a control system.

6. The method of claim 5, wherein the control system adjusts the amount of the monochloride molecules, chloride monomers or chloride dimers of the chloride-based chemical of the chamber by adjusting a growth parameter for forming the semiconductor.

7. The method of claim 1, wherein the radiation to be absorbed has a wavelength between about 100 nanometers and 400 nanometers.

8. The method of claim 1, wherein the radiation to be absorbed has a wavelength between about 185 nanometers and 210 nanometers.

9. The method of claim 1 wherein the electromagnetic radiation is optical radiation, the absorption of radiation is detected by a spectrometer, one or more photodiodes or combinations thereof, and the chamber is associated with a metallorganic chemical vapor deposition (MOCVD) system, a molecular beam epitaxy (MBE) system or a hydride or halide vapor phase epitaxy (HVPE) system.

10. The method of claim 1 wherein the chloride based chemical is gallium chloride, aluminum chloride and indium chloride and the semiconductor that is grown is gallium nitride, aluminum nitride, indium nitrides or an alloy of one or more of these nitrides.

11. The method of claim 1 conducted in a chamber that is operatively associated with a source of the electromagnetic radiation; wherein the absorption is detected by a detector and the operation of the chamber is controlled by a control system.

12. The method of claim 11 wherein the control system controls the operation of the chamber in response to the absorption of radiation by at least one of a monochloride molecule, chloride monomer and chloride dimer of the chloride-based chemical.

13. The method of claim 12 wherein the radiation to be absorbed has a wavelength between about 100 nanometers and 400 nanometers.

14. The method of claim 12 wherein the control system controls the operation of the chamber by adjusting a respective amount of the monochloride molecules, chloride monomers or chloride dimers of the chloride-based chemical.

15. The method of claim 14 wherein the control system adjusts an amount of monochloride molecules, chloride monomers or chloride dimers of the chloride-based chemical of the chamber by adjusting a parameter of the chamber.

* * * * *

UNITED STATES PATENT AND TRADEMARK OFFICE
CERTIFICATE OF CORRECTION

PATENT NO. : 8,431,419 B2
APPLICATION NO. : 13/060639
DATED : April 30, 2013
INVENTOR(S) : Bertram, Jr. et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 156 days.

Signed and Sealed this
Eighth Day of September, 2015

Michelle K. Lee
*Director of the United States Patent and Trademark Office*